(12) United States Patent
Srinivasan et al.

(10) Patent No.: US 8,208,502 B2
(45) Date of Patent: Jun. 26, 2012

(54) FIBER-COUPLED SOLID STATE MICROCAVITY LIGHT EMITTERS

(75) Inventors: Kartik Srinivasan, Gaithersburg, MD (US); Oskar Painter, Sierra Madre, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/866,900

(22) Filed: Oct. 3, 2007

(65) Prior Publication Data

US 2008/0089367 A1    Apr. 17, 2008

Related U.S. Application Data

(60) Provisional application No. 60/848,945, filed on Oct. 3, 2006.

(51) Int. Cl.
  *H01S 3/30* (2006.01)
(52) U.S. Cl. ............ 372/6; 372/40; 372/41; 372/43.01; 372/50.12
(58) Field of Classification Search ................ 372/6, 41, 372/40, 43.01, 50.12
See application file for complete search history.

(56) References Cited

U.S. PATENT DOCUMENTS

| | | | |
|---|---|---|---|
| 6,040,590 A | | 3/2000 | O'Brien et al. |
| 6,370,179 B1 * | | 4/2002 | Deppe et al. ................ 372/96 |
| 6,399,407 B1 | | 6/2002 | O'Brien et al. |
| 6,697,548 B2 * | | 2/2004 | LoCascio et al. ............ 385/16 |
| 6,711,200 B1 * | | 3/2004 | Scherer et al. ............... 372/64 |
| 6,741,628 B2 * | | 5/2004 | Painter et al. ................ 372/92 |
| 6,891,864 B2 * | | 5/2005 | Vahala et al. ................. 372/3 |
| 2005/0094956 A1 * | | 5/2005 | Parker et al. ................ 385/129 |
| 2007/0001773 A1 * | | 1/2007 | Oxborrow ................... 331/154 |

OTHER PUBLICATIONS

Barclay, P.E., et al., "Integration of fiber-coupled high-$Q$ $SiN_x$ microdisks with atom chips", *Appl. Phys. Lett.*, vol. 89, 3 pages, Sep. 2006.
Barclay, P.E., et al., "Nonlinear response of silicon photonic crystal microresonators excited via an integrated waveguide and fiber taper", *Optics Express*, 13(3):801-820, Feb. 2005.
Beveratos, A., et al., "Nonclassical radiation from diamond nanocrystals", *Phys. Rev. A*, vol. 64, 4 pages, Nov. 2001.
Borselli, M., et al., "Rayleigh scattering, mode coupling, and optical loss in silicon microdisks", *Appl. Phys. Lett.*, 85(17):3693-3695, Oct. 2004.
Cai, M., et al., "Fiber-coupled microsphere laser", *Optics Letters*, 25(19):1430-1432, Oct. 2000.
Cai, M., et al., "Observation of critical coupling in a fiber taper to a silica-microsphere whispering-gallery mode system", *Phys. Rev. Lett.*, 85(1):74-77, Jul. 2000.
Dimmick, T.E., et al., "Carbon dioxide laser fabrication of fused-fiber couplers and tapers", *Appl. Optics*, 38(33):6845-6848, Nov. 1999.
Epstein, R.J., et al., "Anisotropic interactions of a single spin and dark-spin spectroscopy in diamond", *Nature Physics*, vol. 1, pp. 94-98, Nov. 2005.
Michler, P., et al., "A quantum dot single-photon turnstile device", *Science*, vol. 290, pp. 2282-2285, Dec. 2000.
Mosor, S., et al., "Scanning a photonic crystal slab nanocavity by condensation of xenon", *Appl. Phys. Lett.*, vol. 87, No. 141105, 3 pages, (2005).

(Continued)

*Primary Examiner* — Kinam Park
(74) *Attorney, Agent, or Firm* — Perkins Coie LLP

(57) ABSTRACT

Designs of fiber-coupled solid state microcavity light emitters based on microdisk cavities, photonic crystal cavities and other microcavity configurations to provide efficient optical coupling.

17 Claims, 17 Drawing Sheets
(17 of 17 Drawing Sheet(s) Filed in Color)

OTHER PUBLICATIONS

Sandoghdar, V., et al., "Very low threshold whispering-gallery mode microsphere laser", *Phys. Rev. A*, 54(3):R1777-1780, Sep. 1996.

Solomon, G.S., et al., "Single-Mode Spontaneous Emission from a Single Quantum Dot in a Three-Dimensional Microcavity", *Phys. Rev. Lett.*, 86(17):3903-3906, Apr. 2001.

Spillane, S.M., et al., "Ultralow-threshold Raman laser using a spherical dielectric microcavity", *Nature*, vol. 415, pp. 621-623, Feb. 2002.

Srinivasan, K., et al., "Cavity $Q$, mode volume, and lasing threshold in small diameter AlGaAs microdisks with embedded quantum dots", *Optics Express*, 14(3):1094-1105, Feb. 2006.

Srinivasan, K., et al., "Experimental demonstration of a high quality factor photonic crystal microcavity", *Appl. Phys. Lett.*, 83(10):1915-1917, Sep. 2003.

Srinivasan, K., et al., "Linear and nonlinear optical spectroscopy of a strongly coupled microdisk-quantum dot system", *Nature*, vol. 450, pp. 862-865, Dec. 2007.

Srinivasan, K., et al., "Optical fiber taper coupling and high-resolution wavelength tuning of microdisk resonators at cryogenic temperatures", *Appl. Phys. Lett.*, vol. 90, No. 031114, 3 pages, Jan. 2007.

Srinivasan, K., et al., "Optical loss and lasing characteristics of high-quality-factor AlGaAs microdisk resonators with embedded quantum dots", *Appl. Phys. Lett.*, vol. 86, No. 151106, 3 pages, Apr. 2005.

Srinivasan, K., et al., "Optical-fiber-based measurement of an ultrasmall volume high-$Q$ photonic crystal microcavity", *Phys. Rev. B*, vol. 70, No. 081306(R), 4 pages, Aug. 2004.

Srinivasan, K., et al., "Photoluminescence measurements of quantum-dot-containing semiconductor microdisk resonators using optical fiber taper waveguides", *Phys. Rev. B*, vol. 72, No. 205318, 9 pages, Nov. 2005.

Srinivasan, K., et al., "Single quantum dot spectroscopy using a fiber taper waveguide near-field optic", *Appl. Phys. Lett.*, vol. 91, No. 091102, 3 pages, Aug. 2007.

Waldermann, F.C., et al., "Creation of high density ensembles of nitrogen vacancy centers in diamond", pp. 1-9, Nov. 2006.

\* cited by examiner

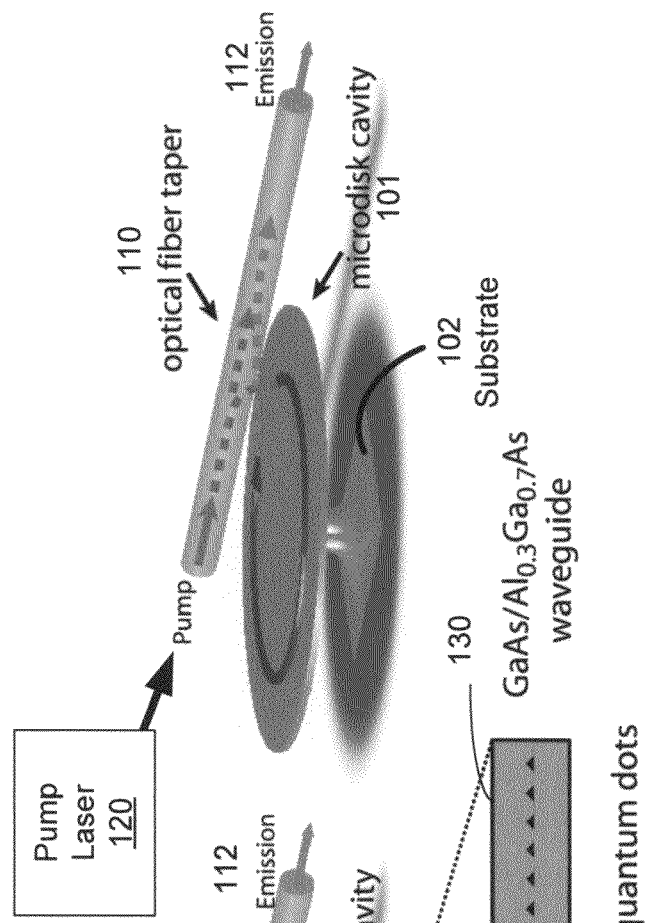
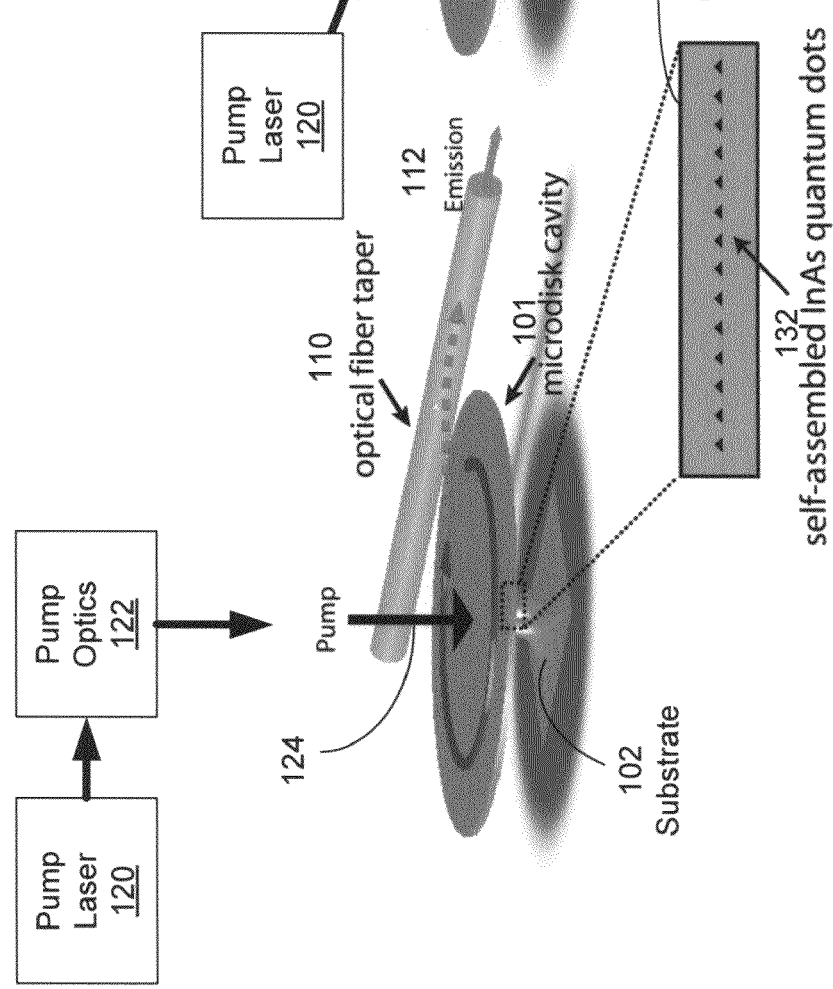

FIG. 2
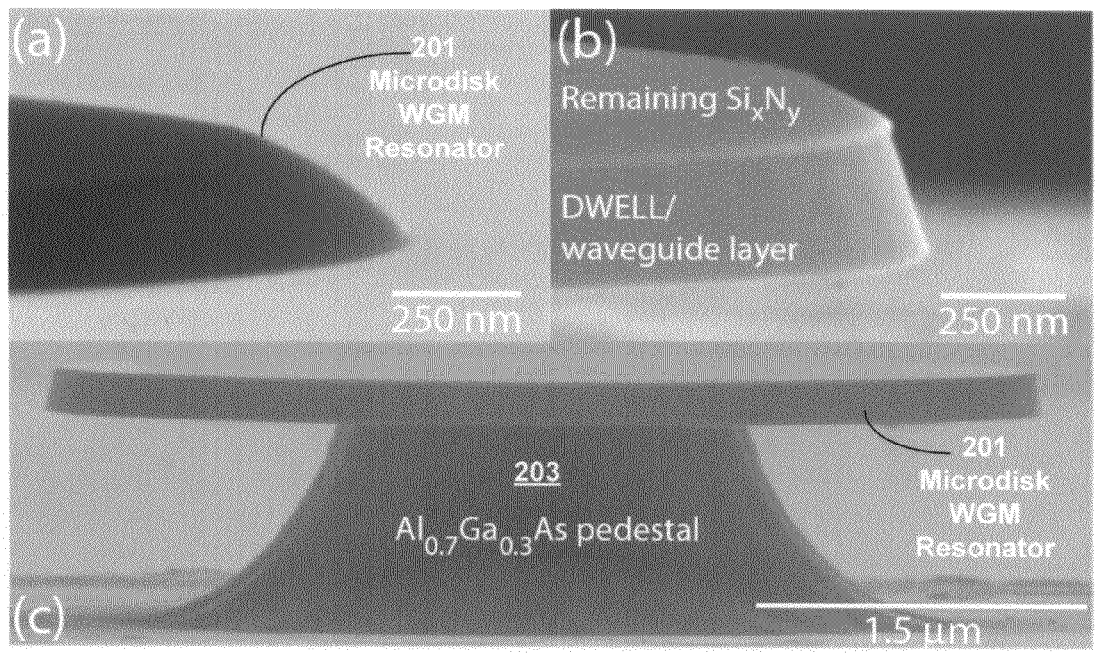
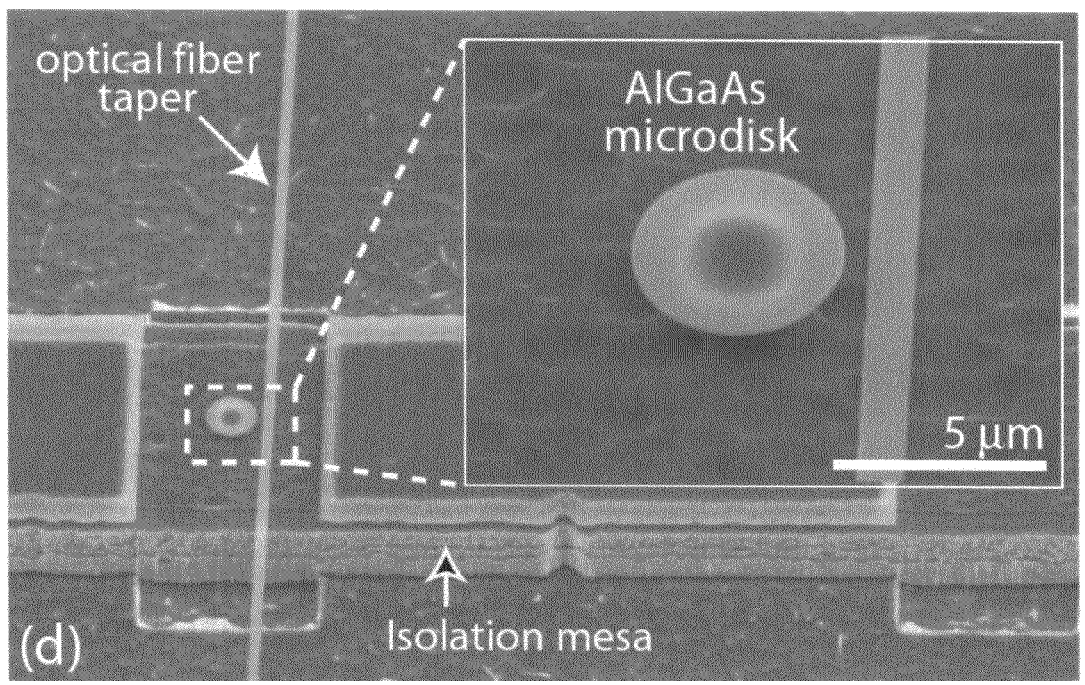

FIG. 11B
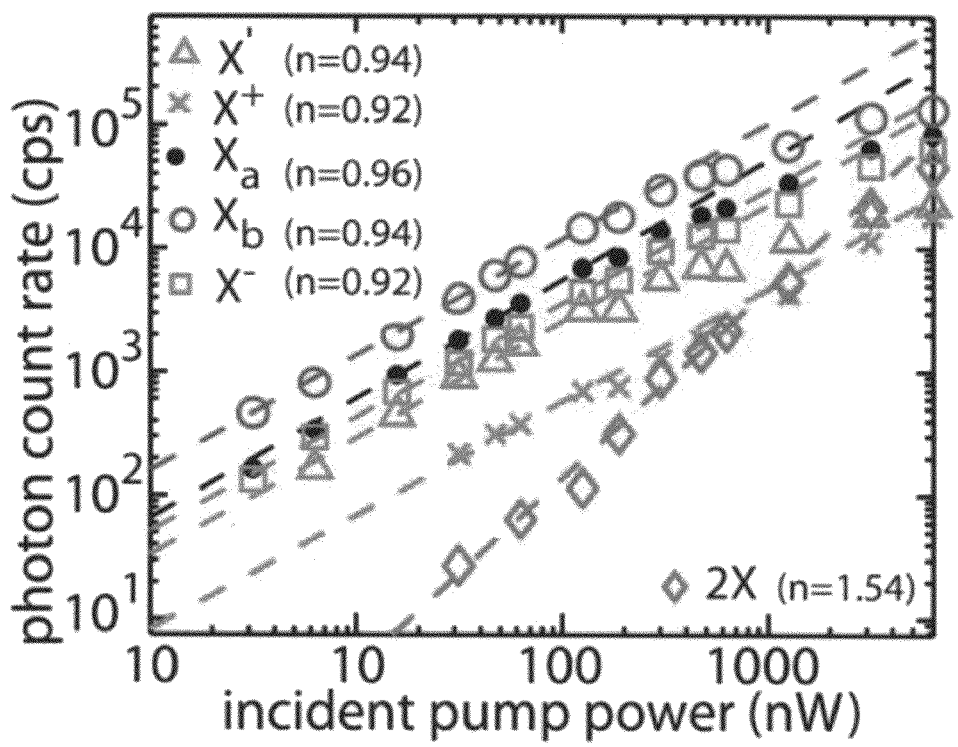
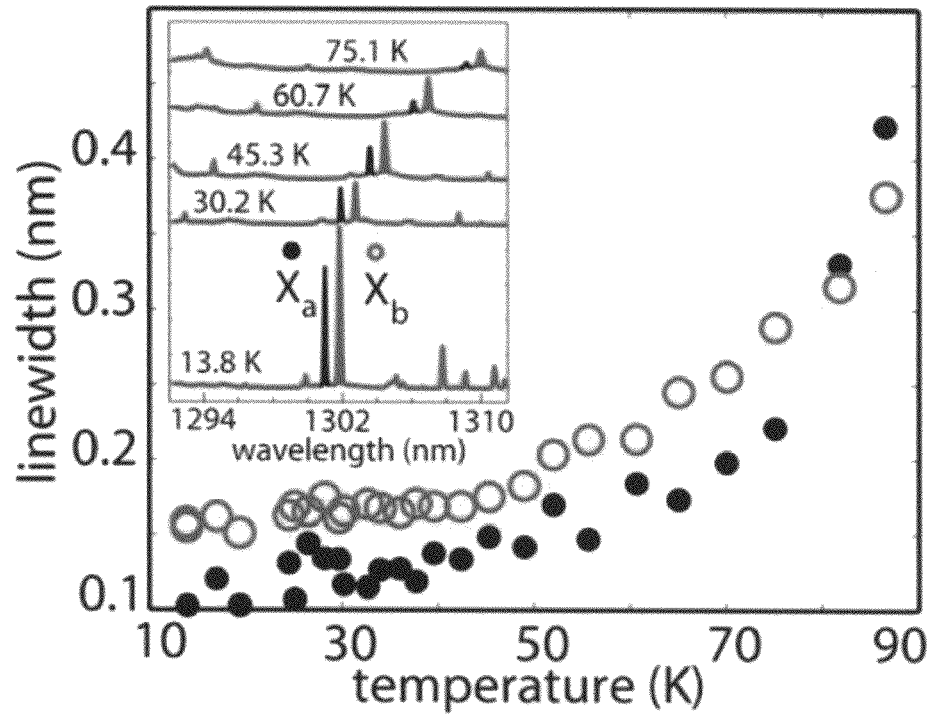
FIG. 11C

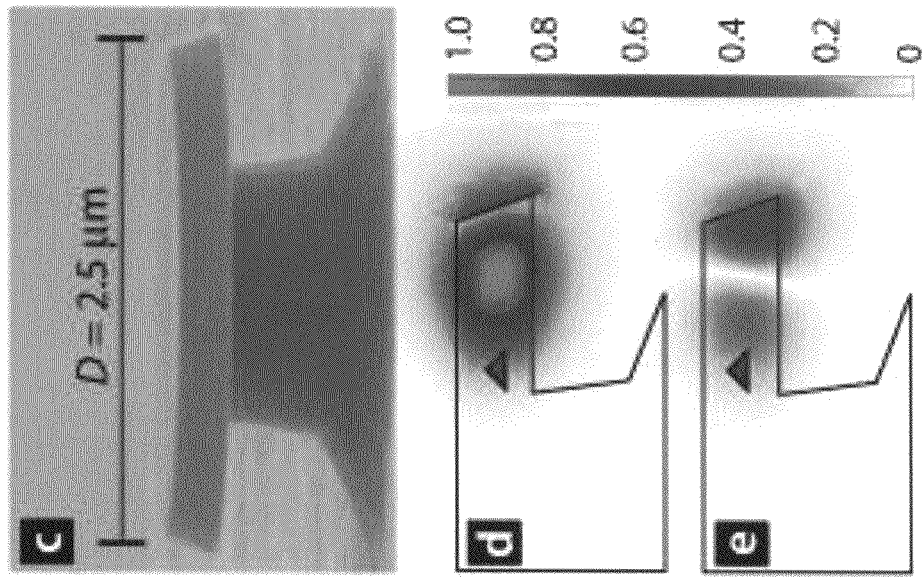
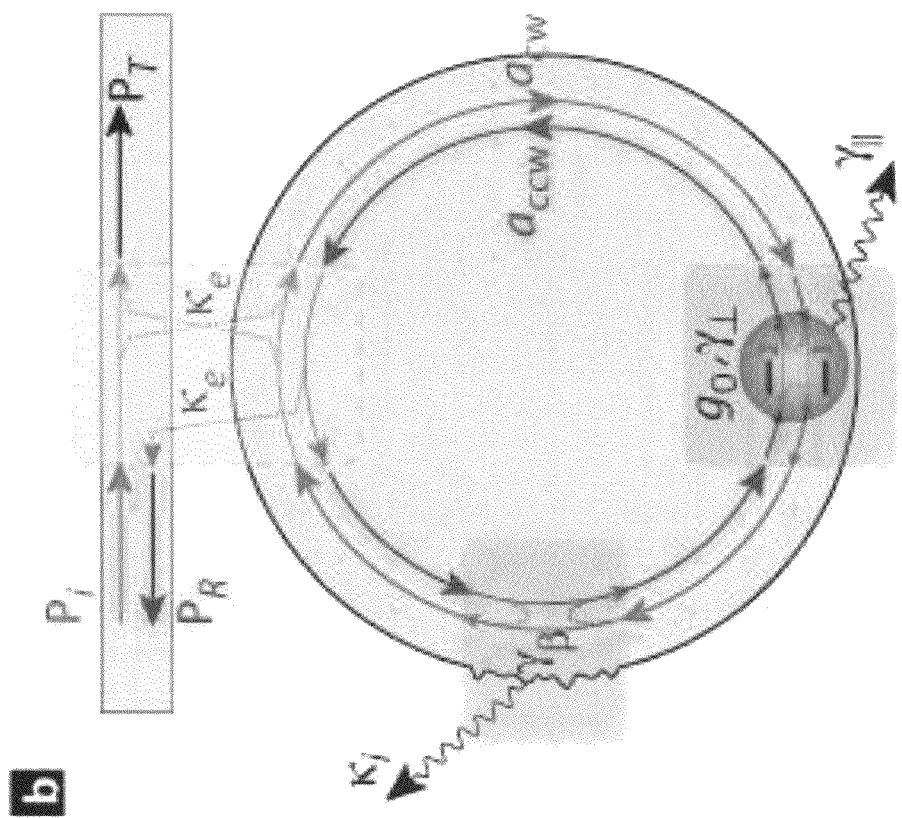
FIG. 13C
FIG. 13B
FIG. 13D and FIG. 13E

US 8,208,502 B2

FIBER-COUPLED SOLID STATE MICROCAVITY LIGHT EMITTERS

PRIORITY CLAIM

This application claims the benefit of U.S. Provisional Application No. 60/848,945 entitled "High Efficiency, Fiber-Coupled Solid State Microcavity Light Emitters" and filed on Oct. 3, 2006, the disclosure of which is incorporated by reference as part of the specification of this application.

BACKGROUND

This application relates to solid state microcavity optical devices including solid state microcavity light emitters.

Optical microcavities are miniaturized optical resonators that confine, store or trap light within small space. Various microcavity configurations are possible, including photonic crystal defect microcavities, whispering gallery mode microdisks, microspheres and microposts, and micro Fabry-Perot resonators. Optical microcavities can be characterized by an effective mode volume Veff which is a measure of the electric field strength per photon within the cavity, and a quality factor Q which is a measure of the photon lifetime within the cavity. Optical microcavities with a small Veff and a high Q offer the promise for applications in nonlinear optics, sensing, and cavity quantum electrodynamics (cavity QED). Chip-based devices are particularly appealing, as planar fabrication technology can be used to make optical structures on a semiconductor chip that confine light to wavelength-scale dimensions to create strong enough electric fields that even a single photon can have an appreciable interaction with matter. When combined with the potential for integration and scalability of microphotonic structures created by planar fabrication techniques, devices based on optical microcavities can be used in various applications.

SUMMARY

The specification of this application describes, among others, fiber coupled microcavity devices and light emitters. In one aspect, an optical device is disclosed to include a microcavity light emitter comprising a semiconductor quantum dot structure that absorbs excitation energy and emits laser light; a single-mode fiber comprising a thinned taper section between first and second single-mode fiber sections and being located near the microcavity light emitter in optical evanescent coupling with the microcavity light emitter to couple a portion of the laser light out of the microcavity light emitter into at least one of the first and second single-mode fiber sections as an output of the microcavity light emitter; and a movable stage on which the microcavity light emitter is mounted, the movable stage being adjustable in position to control a position of the microcavity light emitter relative to be in optical evanescent coupling with the taper section.

In another aspect, an optical device is disclosed to include a device mount; a microcavity light emitter comprising a semiconductor quantum dot structure that absorbs excitation energy and emits laser light; a first positioning stage engaged on the device mount to hold the microcavity light emitter, the first positioning stage to adjust a position of the light emitter on the device mount; a single-mode fiber comprising a thinned taper section between first and second single-mode fiber sections and being located near the microcavity light emitter in optical evanescent coupling with the microcavity light emitter to couple a portion of the laser light out of the microcavity light emitter into at least one of the first and second single-mode fiber sections as an output of the microcavity light emitter; a fiber holding substrate to which the first and second single-mode fiber sections are engaged in a way to bend the thinned taper section under a tension and the center of the thinned taper section is positioned near the microcavity light emitter to evanescently couple with the microcavity light emitter; a second positioning stage on which the fiber holding substrate is mounted, the second positioning stage being adjustable in position to control a position of the fiber holding substrate on the device mount; a cryostat unit to provide cooling; and at least one thermal conductor connected between the microcavity light emitter and the cryostat unit which cools the microcavity light emitter to place the semiconductor quantum dot structure at a cryogenic temperature.

In yet another aspect, an optical device is disclosed to include a substrate; an array of microcavity light emitters monolithically formed on the substrate, each comprising a semiconductor quantum dot structure that absorbs excitation energy and emits laser light; and at least one single-mode fiber comprising a thinned taper section between first and second single-mode fiber sections and being located near the microcavity light emitter in optical evanescent coupling with at least one microcavity light emitter to couple a portion of the laser light out of the microcavity light emitter into at least one of the first and second single-mode fiber sections as an output of the microcavity light emitter.

These and other examples and implementations are described in detail in the drawings, the detailed description, and the claims.

BRIEF DESCRIPTION OF THE DRAWINGS

The patent or application file contains at least one drawing executed in color. Copies of this patent or patent application publication with color drawings will be provided by the Office upon request and payment of the necessary fee.

FIGS. 1A and 1B show two examples of fiber-coupled microcavity devices.

FIG. 2 illustrates scanning electron microscope (SEM) images of an AlGaAs microdisk laser containing embedded quantum dots-in-a-well (DWELL) during fabrication and after completion of the fabrication.

FIGS. 13A-13E show use of a fiber taper waveguide to perform direct optical spectroscopy of a microdisk-quantum-dot system.

DETAILED DESCRIPTION

Figures 3A, 3B:
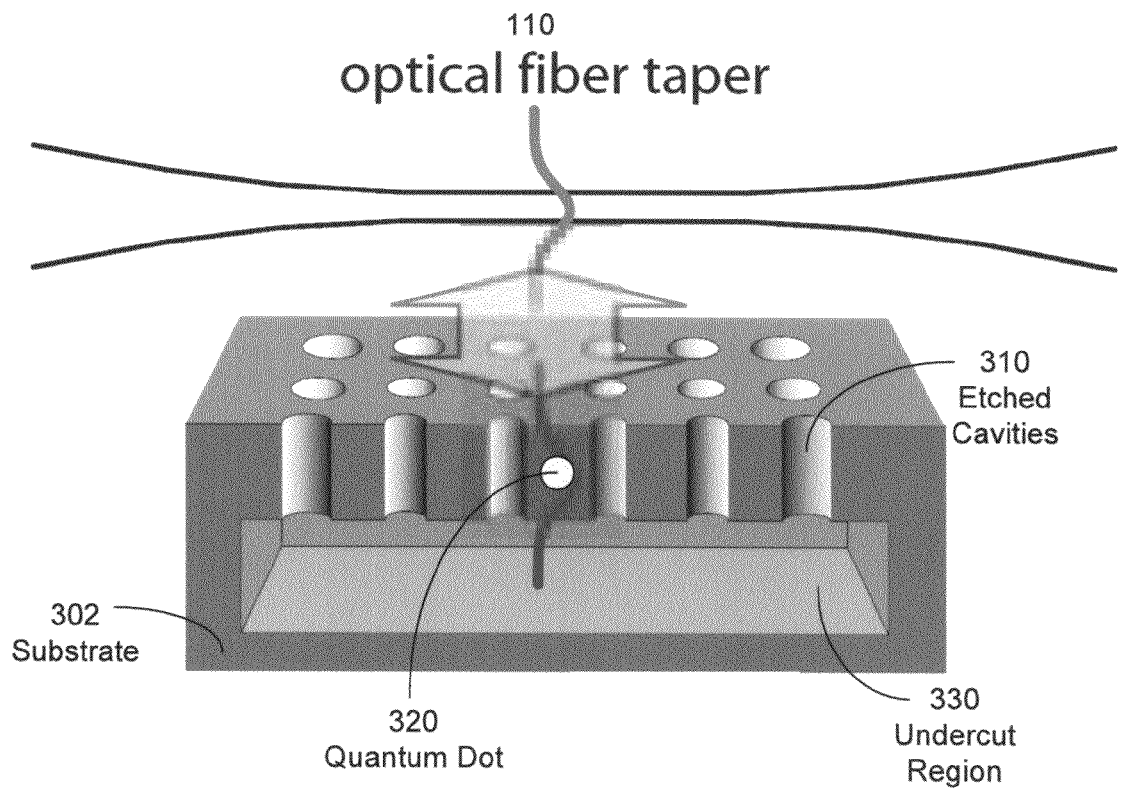
FIGS. 3A and 3B show examples of a photonic crystal microcavity array.

Confined light in optical microcavities have a spatial distribution that extends beyond the physical boundaries of optical microcavities. The part of a confined optical field outside an optical microcavity is sometimes known as the evanescent field and can be used for coupling energy of the confined light out of the optical microcavity to produce an optical output or for coupling an input optical signal into an optical mode of the optical microcavity. Such optical evanescent coupling can be achieved by using a tapered optical waveguide with a dimension of the waveguide cross section on the order of one wavelength of the light. Various optical waveguides may be used and examples described in this application use single-mode fiber tapers to construct fiber-coupled microcavity light emitters and other devices.

In one aspect, optical fiber taper waveguides can be used to efficiently inject and extract light from solid-state microcavity resonators with an embedded or introduced gain medium. This efficient optical coupling allows for the creation of a host of microcavity light emitters in which optical pumping and collection of emission are both accomplished through a single fiber. Specific applications include room temperature lasers and low temperature triggered single photon sources employing gain materials such as semiconductor quantum wells or quantum dots.

FIGS. 1A and 1B illustrate two examples of fiber-coupled solid state microcavity light emitters or light-emitting devices based on a microdisk cavity. In FIG. 1A, a microdisk cavity 101 is formed on a substrate 102 and a pedestal is fabricated on the substrate 102 to support the microdisk cavity 101 above the substrate 102. The microdisk cavity 101 forms a whispering gallery mode resonator that supports one or more optical whispering gallery modes at or near the rim of the disk. The microdisk cavity 101 can be formed of a semiconductor material (e.g., GaAs/AlGaAs) and be configured to include a quantum well structure or quantum dot structure as an active optical gain medium for generating light under optical or electrical excitation. The microdisk cavity 101 receives and confines the generated light in one or more optical modes of the microdisk cavity 101 and provides an optical feedback and an optical filtering mechanism to effectuate a laser. As a specific example for the optical gain medium, FIG. 1A shows a semiconductor waveguide 130 made of GaAs/AlGaAs with self-assembled InAs quantum dots 132 inside the GaAs/AlGaAs waveguide 130. The density of the quantum dots 132 can be low such as one quantum dot per one micrometer square to effectuate a single quantum dot (SQD) emission.

A single-mode fiber 110 is provided in FIGS. 1A and 1B to provide optical coupling with the microdisk cavity 101. A middle section of the single-mode fiber 110 is thinned (e.g., stretched under heat) to form a fiber taper section with a diameter of approximately 1 to 2 microns for evanescent coupling. Under this design, the single-mode fiber 110 has one fiber section on one side of the tapered fiber section that decreases in diameter along the lengthwise of the fiber 110 and another fiber section on the other side of the tapered fiber section that increases in diameter along the lengthwise of the fiber 110. Depending on the needed coupling between the microdisk cavity 101 and fiber 110, the tapered section of the fiber 110 can be placed in direct contact with the rim of the microdisk cavity 101 or in a near-field configuration with a small spacing from the rim of the microdisk cavity 101.

In FIG. 1A, the fiber taper is used as an efficient optical output coupler to extract emitted light from the microdisk cavity 101. The quantum well structure or quantum dot structure in the microdisk cavity 101 can be optically excited or electrically excited to produce the optical gain for generating the laser light. When electrical excitation is provided, a driver circuit is coupled to the quantum well structure or quantum dot structure in the microdisk cavity 101 to inject an electrical current which causes emission of light. When optical excitation is used, a pump laser 120 can be used to produce the laser pump light and a pump optical unit 122 which can include a lens can be used to focus and direct the laser pump light via free space to the microdisk cavity 101. The pump light is in resonance with and is absorbed by the quantum well structure or quantum dot structure in the microdisk cavity 101 to emit laser light at a wavelength longer than the pump wavelength.

In FIG. 1B, the pump light is first coupled into the single-mode fiber 110 by using a pump coupling optical module which can include a collimator lens unit. The fiber 110 guides the pump light to the tapered section in evanescent coupling with the microdisk cavity 101 to couple the pump light into the microdisk cavity 101. Therefore, both emitted light extraction and optical pumping is accomplished through the fiber taper.

The device designs in FIGS. 1A and 1B were used to construct fiber-coupled microdisk lasers in the AlGaAs material system, where optical gain is provided by a single layer of InAs quantum dots embedded within the cavity. Such microdisk lasers were demonstrated with both pulsed and continuous wave optical pumping.

FIG. 2 illustrates scanning electron microscope (SEM) images of an AlGaAs microdisk laser containing embedded quantum dots-in-a-well (DWELL) during fabrication and after completion of the fabrication. The epitaxy layers of this device is shown in Table 1 below and include a single layer of InAs quantum dots embedded in an InGaAs quantum well, which is in turn sandwiched between layers of AlGaAs and GaAs to create a 255 nm thick waveguide. This DWELL material has a room temperature ground state emission peak at around 1190 nm and is grown on top of a 1.5-μm $Al_{0.3}Ga_{0.7}As$ layer that eventually serves as a support pedestal for the microdisk. The cavities are created through: (i) deposition of a 200 nm SiNx mask layer, (ii) electron beam lithography and subsequent reflow of the e-beam resist to produce smooth and circular patterns, (iii) SF6/C4F8 inductively coupled plasma reactive ion etching (ICP-RIE) of the deposited SiNx mask layer (FIG. 2(a)), (iv) Ar—Cl2 ICP-RIE etching of the $Al_{0.3}Ga_{0.7}As$ layer and removal of the remaining SiNx layer, (v) photolithography and isolation of the microdisk onto a mesa stripe that is several microns above the rest of the chip (FIG. 2(d)), and (vi) HF acid wet chemical etching of the underlying $Al_{0.3}Ga_{0.7}As$ layer to form the supporting pedestal (FIGS. 2(b) and 2(c)). The e-beam lithography and SiNx etch steps are particularly important, as any roughness in the mask layer is transferred into the AlGaAs region. A resist reflow process originally developed for use with Si microdisks is employed to create an initial mask pattern that is as circular as possible, and the subsequent SiNx etch has been calibrated to produce as smooth a sidewall surface as possible (FIG. 2(a)) without particular concern for its verticality. The subsequent Ar—Cl2 etch is highly selective so that the angled mask does not result in erosion of the AlGaAs sidewalls. The fabricated microdisk is about 4.5 μm in diameter.

TABLE 1

| Layer | Materials | Thickness |
| --- | --- | --- |
| Surface cap layer | GaAs | 100 Å |
| Top waveguide layer | $Al_{0.30}Ga_{0.70}As$ | 400 Å |
| Top waveguide layer | GaAs | 740 Å |
| Quantum well layer | $In_{0.15}Ga_{0.85}As$ | 60 Å |
| Quantum dot layer | InAs | 2.4 monolayer |
| Barrier layer | $In_{0.15}Ga_{0.85}As$ | 10 Å |
| Bottom waveguide layer | GaAs | 740 Å |
| Bottom waveguide layer | $Al_{0.30}Ga_{0.70}As$ | 500 Å |
| Sacrificial buffer layer | $Al_{0.70}Ga_{0.30}As$ | 15000 Å |
| Substrate | GaAs | N/A |

FIG. 2(d) shows the fully processed device. The isolation mesa is incorporated to aid in the taper testing. An optical fiber taper aligned to the side of a microdisk is shown in this image.

Our tests with AlGaAs microdisks show Q factors as high as $3.6 \times 10^5$ at $\lambda$ of about 1.4 µm. The embedded quantum dots-in-a-well have a ground state emission at a wavelength $\lambda$ of about 1.2 µm. The passive, fiber-taper-based measurements were performed at $\lambda$ of about 1.4 µm, where the QDs are relatively non-absorbing.

The microcavity resonators can be made of a high refractive index material with an index of $n \geq 2$ in a III-V semiconductor material system such as the InP/InGaAsP or GaAs/AlGaAs systems or other suitable semiconductor material systems. The microcavity resonators can be configured as, e.g., microdisks or photonic crystal cavities that contain an integral layer or layers of semiconductor quantum wells or quantum dots. Other high-refractive index materials, such as silicon nitride or silicon oxynitride, may be used for integration with introduced gain materials such as colloidal quantum dots or nitrogen vacancy centers in diamond nanocrystals, where the short-infrared to near-visible emission wavelengths are incompatible with most semiconductor materials. In such devices, the introduced gain material may be grown or spin-coated on top of the microcavity resonator.

FIG. 3A illustrates an example of a semiconductor microcavity light emitter based on a planar array of photonic crystal (PC) microcavities. A semiconductor substrate 302 is patterned to have a planar array of etched photonic crystal microcavities 310 and an undercut region 330 is formed below the etched cavities inside the substrate 302. One or more quantum dots 320 are formed between the etched photonic crystal microcavities 310. The single-mode fiber 110 is positioned to place the taper section to be approximately parallel to the substrate surface and above the photonic crystal microcavities 310 to provide evanescent coupling with the light in the semiconductor microcavity light emitter. The one or more quantum dots 310 can be optically or electrically excited to produce laser light. The patterned core layer with etched cavities 310 is surrounded by spatially uniform cladding layers. The semiconductor core dielectric material has an approximate refractive index of 3.4, and the cladding in these membrane-type structures is air with a refractive index of 1. In some designs, the ratio of the core thickness, d, to lattice constant, a, is chosen so as to maintain the single-mode nature of the vertical waveguide for wavelengths within the first-order guided-mode bandgap of the PC lattice. The modes of a symmetric slab waveguide, patterned or unpatterned, separate into modes of even or odd parity with respect to a mirror plane in the middle of the dielectric slab. The fundamental even and odd modes can be represented by scalar fields $H_z$ and $E_z$, respectively. For connected 2D lattices, the extent of the photonic bandgap for modes with electric field polarization in the plane of the 2D patterning (TE) is larger than for modes with normal electric field polarization (TM). An example of the device design in FIG. 3A is described below to demonstrate a high Q factor of about $1.3 \times 10^4$ in a PC microcavity in an InP-based structure using plasma etching.

TABLE 2

| Layer | Materials | Strain (rel. to InP) | Thickness | Doping ($cm^{-3}$) |
| --- | --- | --- | --- | --- |
| Separate confinement | 1.12Q | unstrained | 810 Å | undoped |
| Half-barrier | GaInAsP | 0.65% tens. | 60 Å | undoped |
| Active region { | 5 wells | 1.5% comp. | 60 Å | undoped |
|  | 4 barriers | 0.65% tens. | 120 Å | undoped |
| Half-barrier | GaInAsP | 0.65% tens. | 60 Å | undoped |
| Separate confinement | 1.12Q | unstrained | 810 Å | undoped |
| Sacrificial buffer layer | InP | unstrained | 15000 Å | undoped |
| Etch stop | InGaAs | unstrained | 200 Å | undoped |
| Substrate | InP | unstrained | N/A | N/A |

As an example, the device in FIG. 3A can be fabricated by using a solid source molecular beam epitaxy with five InAsP compressively strained quantum wells separated by InGaAsP barriers. Table 2 shows the epitaxy for 1.3 µm PC microcavity lasers, in which 1.12 Q stands for quaternary GaInAsP layers, lattice matched to InP. The quantum well layers are $InAs_{0.48}P_{0.52}$ and the barrier layers are $Ga_{0.24}In_{0.76}As_{0.32}P_{0.68}$. The final membrane thickness after undercutting the sacrificial InP layer is 252 nm. The peak emission wavelength is at $\lambda=1284$ nm, and the epitaxy is designed so that, upon undercut of the 1.5 µm sacrificial InP layer, a 252-nm thick free-standing membrane is formed and the thickness is chosen to be consistent with the emission wavelength of the quantum wells and the FDTD-calculated frequency of the cavity mode. The creation of the 2D PC membrane is accomplished through electron beam lithography, pattern transfer to a $SiO_2$ mask using an inductively coupled plasma reactive ion etch (ICP/RIE), and a high-temperature (205 C) Ar—Cl2 ICP/RIE etch through the active material into a sacrificial InP layer. The sample is undercut by removing the InP layer with a $HCl:H_2O$ (4:1) solution.

A fiber taper can include a standard single mode optical fiber with 9 µm in core diameter and 125 µm in cladding diameter. The fiber is simultaneously heated and stretched down to a minimum diameter (d) on the order of the wavelength of light ($\lambda$) which is about 1 to 2 microns for light with wavelengths around 1.6 µm. A hydrogen-based torch may be used to heat the fiber and other techniques such as heating with a $CO_2$ laser may also be used. In a taper with a suitably adiabatic transition region, the insertion loss through the taper can be about 10%. The taper is mounted onto an acrylic block in a u-shaped configuration, and the block is then fastened to a DC motor-controlled ^z-axis stage with 50 nm step size resolution. Mounting the taper in this fashion naturally keeps it under tension and prevents the taper position from excessively fluctuating due to environmental factors (such as fluctuating air currents in the laboratory). The microcavity chip is in turn mounted on a DC motor-controlled ^x- ^y-axis stage with 50 nm step size resolution; in this way, the fiber taper can be precisely aligned to a microcavity. The taper-cavity interaction region is imaged with a microscope onto a CCD camera. The vertical separation between the taper and cavity can easily be calibrated by stepping the taper down in 50 nm increments until it just touches the cavity (this can be seen optically through the microscope), establishing the motor readout corresponding to a zero gap. Determining the separation in this manner is made possible by the mechanical robustness of the taper, which allows it to withstand contact to the semiconductor chip without breaking.

FIG. 3B shows SEM micrographs of a fully fabricated PC microcavity with dimensions of 13 μm×16 μm. FIG. 3B(a) shows a cross-sectional view. FIG. 3B(b) shows a top view of the portion of the cavity contained within the dashed lines in FIG. 3B(a). FIG. 3B(c) shows a zoomed-in angled view of the dashed line region in FIG. 3B(b) to reveal the smoothness and verticality of the etched air hole sidewalls which limit scattering loss and radiative coupling to TM-like modes.

Light emission is obtained by filling the excited state(s) of the gain material with carriers, which upon relaxation into lower energy state(s), release photons at a frequency commensurate with the energy difference between these states. In practice, this is achieved through methods such as optical pumping of the device at a wavelength below the bandgap of the host material, or direct electrical injection of carriers into the structure (either pulsed or continuous wave pumping can be used for each method). The microcavity resonator provides optical feedback and spectral filtering of the emission, and under appropriate conditions (if the cavity mode gain exceeds the cavity mode loss), can be used to create a laser. The dimensions of the resonator have an effect on the strength of the light-matter coupling within the device, and in particular, as cavity dimensions are shrunk to the extent that the resonant optical modes of the device occupy a volume that is on the order of a cubic wavelength in the material, strong light-matter interactions can occur. Such strong light-matter interactions play an important role in devices in which the number of emitting elements (e.g. quantum dots) is small.

The fiber taper is used an optical interface to inject light into the cavity (for optically pumped devices) and extract emission from the cavity and to provide high coupling efficiency. For high refractive index microcavity resonators, developing an efficient optical interface can be problematic, for a number of reasons. First, the cavity dimensions can be quite small (micron to sub-micron scale), leading to a spatial mismatch between the cavity modes and the modes of the standard free-space and fiber-optic-based devices used on the source (for optical pumping) and detection end. Second, the high refractive index of the microcavity causes an additional difficulty in that the phase velocity of light propagating through the cavity is significantly slower than that of light propagating through air or a glass fiber. These difficulties can be overcome through use of an optical fiber taper waveguide to couple to the microcavity resonator. The fiber taper is a single mode optical fiber that has been heated and stretched until its minimum diameter is approximately 1-2 microns. Unlike tapered optical fiber probes used in applications such as near-field scanning optical microscopy, which terminate at their minimum diameter, the fiber tapers we use taper down to a micron scale region and then taper back up to the diameter of a standard single mode fiber. The transition between macroscopic dimensions (diameter~125 microns) and microscopic dimensions (diameter~1 micron) is done adiabatically, and the propagating losses through the entire device can be quite low (<10% routinely).

Optical fiber tapers have previously been used for efficient coupling to glass microcavities such as microspheres, where the efficiency of coupling is primarily due to matching of the phase velocity of light within the two elements, which occurs in large part because the waveguide and cavity are made of the same material and thus have the same index of refraction. This phase matching ensures that, if the transverse spatial mode overlap between the waveguide and cavity modes is adequate, efficient power transfer can occur. In coupling to high-refractive index microcavities, the material refractive indices can be quite different (n~3.5 for a semiconductor vs. n~1.45 for glass), so that phase matching is not as easily or directly achieved. However, we have discovered that, by tailoring the cavity geometry appropriately, significant spatial overlap and high efficiency coupling can be achieved. For microdisk cavities, this involves optimization of the microdisk diameter and thickness, while for photonic crystal cavities, tailoring of the cavity design (lattice spacing and hole radius, for example) and/or on-chip coupling to an intermediate waveguide that is dispersion engineered to phase-match to the fiber taper can be employed.

In addition to lasers, another important light-emitting device that can be created from this architecture is a fiber-coupled, triggered single photon source. One method for achieving triggered single photon generation is to use a pulsed laser source to optically pump a microcavity containing a single quantum dot. Because a quantum dot in its excited state can emit at most one photon, such a device produces single photon pulses at a rate equal to the repetition rate of the pulsed laser source. In solid-state single photon sources demonstrated to date, the microcavity serves to (i) spectrally filter the emission, (ii) enhance the emission rate of the quantum dot by the Purcell effect, and (iii) funnel the quantum dot emission into the microcavity mode, which, under ideal circumstances, is significantly easier to collect than the emission of a quantum dot in bulk (unprocessed) material.

The optical fiber taper coupling provides a method to not only extract single photon pulses from the microcavity-quantum-dot system, but also a way to efficiently inject pump light into the system. Such semiconductor-based single photon sources typically operate in high vacuum (P~$10^{-5}$-$10^{-6}$ torr) and at cryogenic temperatures (T~4-40 K), as temperatures above this lead to a significant degradation of the quantum dot behavior and its ability to generate single photon events. The optical fiber taper coupling technique described in this application provides needed optical coupling to microcavity resonators in a vacuum environment at cryogenic temperatures. A robust method for affixing the fiber taper onto a mount is provided in this application. In addition, a mechanism for positioning the fiber taper and/or microcavity chip with respect to each other is provided. There are a number of difficulties in accomplishing this. One is the potentially deleterious effects low temperatures may have on the mechanism for holding the fiber taper, for example, due to differing thermal expansion coefficients between the glass fiber and the material it is mounted on. A second is the potential for vibrations of the fiber taper to make positioning of it within the cavity's near-field (i.e., within ~1 micron, to achieve optical coupling) problematic. In particular, because the experiments occur within high vacuum, any vibrations in the taper will not be damped by air molecules as they are in typical room temperature testing. If the fiber is to be positioned by actuators moving in discrete steps, the impulse produced by the actuator during its movement may induce vibrations in the fiber taper whose amplitude is far larger 1 micron, making optical coupling extremely difficult.

One approach to counteracting potential taper vibration problems is to mount the optical fiber in a u-shaped configuration. This provides a self-tensioning of the fiber that is significantly stronger than what is achieved when the fiber taper is mounted in a straight configuration. The fiber taper is kept at a fixed position and positioners are used to move the microcavity chip relative to the fixed fiber taper. In one implementation, the following setup is used. (i) The u-mounted fiber taper is placed on a piezo-electric flexure stage that is mounted on an adapter plate before being affixed on the sample platform that is connected to the cryostat cold finger. This flexure stage allows for continuous motion of the taper as the piezo-electric element is extended, with maximum displacements of a few microns. As no impulse is applied (the stage does not operate in 'step' or 'slip-stick' mode), this does not induce vibrations in the taper. (ii) The sample is placed on a copper mount that is affixed on top of a piezo-actuated translation stages that operate in "slip-stick" mode, offering mm of motion instead of the 1-10 microns the piezo electric flexure stage gives. Thus, between slip-stick motion of the sample and piezo-extension of the flexure stage, the sample can be positioned with respect to the fiber taper, and sub-micron taper-cavity gaps can easily be achieved. We note that a thermally conductive pathway between the sample and the cold finger is provided by copper "thermal braids" that connect the copper mount on which the sample sits with the cold finger. This ensures that the sample can get to the requisite low temperatures (<15 K). On the other hand, we have intentionally tried to thermally isolate the fiber taper from the cold finger (no thermal braids are used), so that the temperature of the fiber taper (and mount) is significantly higher than that of the cold finger. By keeping the temperature of the fiber taper assembly elevated, we minimize potential strain issues associated with the dissimilar thermal expansion coefficients of the materials within the assembly.

The above setup was used to demonstrate optical fiber taper probing of GaAs/AlGaAs microdisk cavities with embedded quantum dots at cryogenic temperatures of about 13 K and can be used to implement fiber-coupled single photon sources. The fiber-coupled single photon source architectures presented here are not limited to a semiconductor microcavity and epitaxially grown quantum dot. In particular, single photon emission has been demonstrated in a number of other systems, including nitrogen vacancy (N-V) centers in diamond nanocrystals. The emission wavelength for these structures lies within the absorption band for most semiconductor materials, so that semiconductor-based microcavities would not be appropriate for devices employing these N-V centers. Silicon nitride, on the other hand, has the benefit of both a relatively high material refractive index (n~2.0), ensuring the ability to create small mode volume cavities, and also material transparency over much of the visible and infrared spectrum. Thus, a single photon source consisting of a fiber-pigtailed silicon nitride microcavity couple to a diamond nanocrystal containing a single N-V center is one application of the present designs and techniques.

The designs and techniques described in this application can be implemented by using various semiconductor gain materials, such as the widely used and technologically mature InP/InGaAsP and GaAs/AlGaAs systems, high gain materials in multi-quantum-well heterostructures and stacked layers of quantum dots in a variety of operating wavelengths (~900-1600 nm). Conversely, very low gain materials, essentially involving isolated quantum dots, can be employed to create the single photon sources mentioned above. Semiconductor materials such as GaAs or InP have a much higher refractive index than silica (n~3.5 vs n~1.45), so that the optical fields can be confined to much smaller volumes. This has implications both in terms of the density of devices on a chip and on the strength of the light-matter interaction occurring within the devices. As described above, the microcavity refractive index also has implications in terms of the efficiency of coupling to the optical fiber taper. The present designs and techniques can be used to provide efficient fiber coupling that has been available to silica microcavities in coupling with solid-state microcavities of high refractive indices. Single photon sources can be implemented by using the present designs and techniques to directly transfer single photon pulses into optical fibers. This is of direct importance to a number of proposed applications in quantum information processing, computing, and cryptography.

The present designs and techniques can be used to construct various microcavity devices. Examples include (1) fiber-taper-coupled microcavity lasers can be built employing a single quantum well layer or multiple quantum well layers as a gain medium, and employing free-space optical pumping and fiber taper output coupling of emitted light; (2) fiber-taper-coupled microcavity lasers employing a single quantum dot layer or multiple quantum dot layers as a gain medium, and employing free-space optical pumping and fiber taper output coupling of emitted light; (3) fiber-taper-coupled microcavity lasers employing a single quantum well layer or multiple quantum well layers as a gain medium, and employing optical pumping and collection of emission through the optical fiber taper; and (4) fiber-taper-coupled microcavity lasers employing a single quantum dot layer or multiple quantum dot layers as a gain medium, and employing optical pumping and collection of emission through the optical fiber taper. Electrical injection for exciting the quantum well or quantum dot gain medium can be used to replace optical pumping in the above and other examples. An electrically injected structure may be a p-i-n structure, for example, where the microdisk region consists of a thin p-doped layer grown on top of an intrinsic (i) layer containing the gain material (semiconductor quantum dots or quantum wells), and where the substrate is n-doped. Current will then be applied to a top contact consisting of a thin metal disk on top of the semiconductor that is connected by an air-bridge to a larger metal contact pad on the surface of the microcavity chip. The bottom contact can be a metal layer that is applied to the backside of the microcavity chip.

Additional examples of microcavity devices based on the present designs and techniques include (1) fiber-taper-coupled triggered single photon source utilizing semiconductor quantum dots within an optical microcavity, employing free-space optical pumping with a pulsed laser source such as a Ti:sapphire laser, and collecting the generated single photon pulses by the optical fiber taper; (2) fiber-taper-coupled triggered single photon source utilizing semiconductor quantum dots within an optical microcavity, employing optical pumping through the fiber taper with a pulsed laser source such as a Ti:sapphire laser, and collecting the generated single photon pulses through the optical fiber taper; and (3) fiber-taper-coupled triggered single photon sources employing a SiNx microcavity integrated with a single matter excitation such as an N-V center in a diamond nanocrystal or a colloidal quantum dot. Depending on the material used, single photon emission may occur at visible wavelengths (e.g., 632 nm for an N-V center).

Solid-state microcavities can be fabricated through planar fabrication techniques and can form microcavity arrays on a single chip. Therefore, various devices based on the designs and techniques in this application can be expanded to a multiple device level, where all of the devices monolithically co-exist within a single chip. Different microcavities on the chip may be coupled to different fiber tapers in different fibers that are designated to the microcavities, respectively. Alternatively, some or all of the microcavities on the chip can be coupled to a shared optical fiber taper or coupled to different fiber taper sections in a common fiber. By slightly varying the cavity geometry from device to device on a single chip during the lithographic definition stage of device fabrication, each device can have a different resonant wavelength and resonant wavelengths are limited to those within the gain bandwidth of the emitting material. Therefore, a chip with different microcavities configured to have different resonant frequencies can be used to achieve a multi-wavelength operation.

In addition, two different fiber tapers of two different fibers can be coupled to a single microcavity, to create a four-port coupling configuration that may be useful for injecting or extracting light from/to multiple optical channels. Fiber-coupled microcavities can also serve as an optical sensor for introduced materials with an index less than that of the cavity. The introduced material may shift the cavity's resonant wavelength (refractive index change) or increase the absorption of the cavity, for example, with either change detectable through monitoring of the output of the optical fiber taper. The optical sensor can be created out of passive cavities that do not contain a gain medium, or from light-emitting devices.

Figure 4:
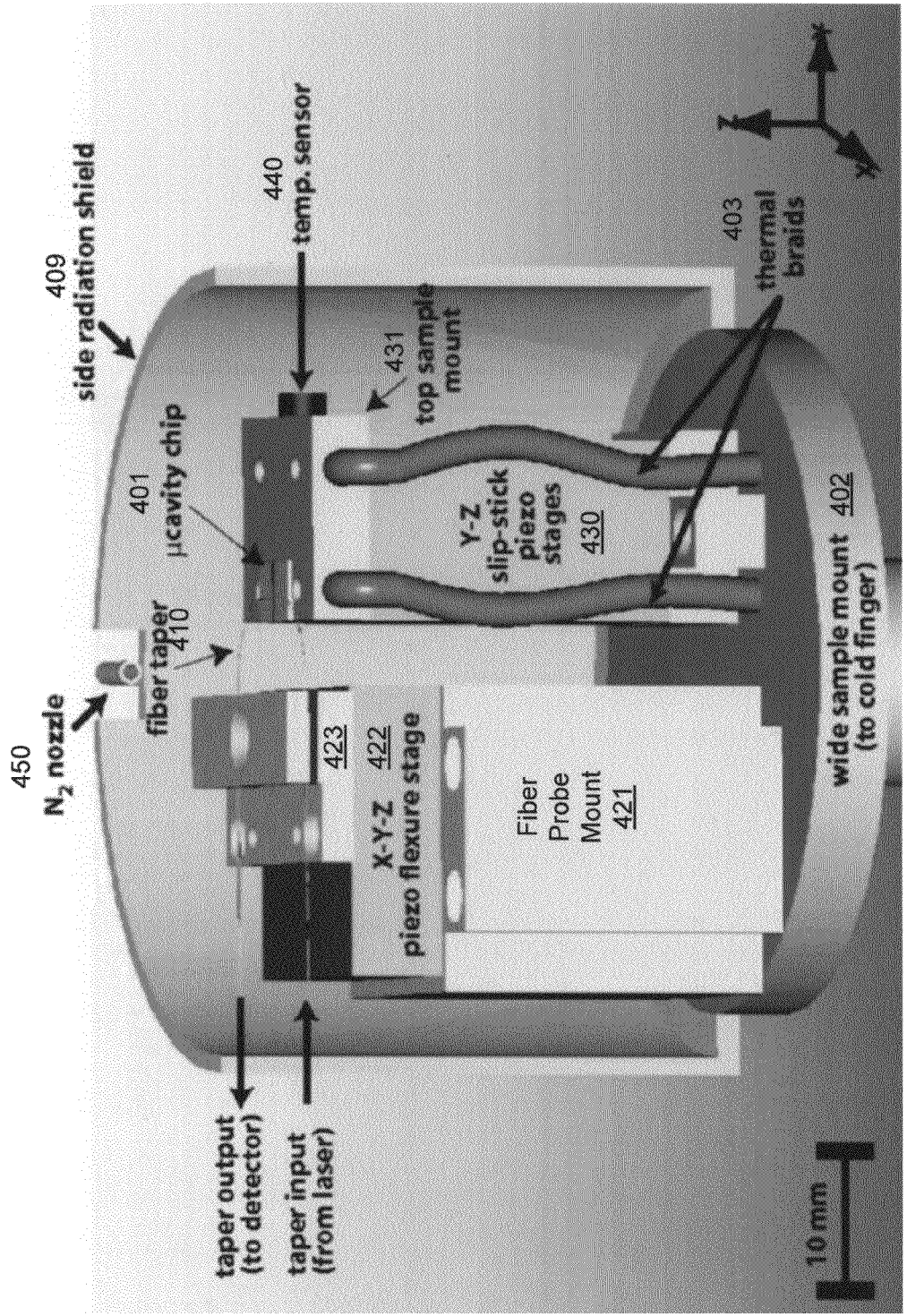
FIG. 4 shows an example of a fiber-coupled microcavity device under a high vacuum and in a cryogenic environment.

FIG. 4 shows an example of a fiber-coupled microcavity device under a high vacuum ($\sim 10^{-6}$ Torr) and in a cryogenic ($\sim 10$ K) environment. This system is used to interrogate wavelength-scale GaAs/AlGaAs microdisk cavities containing self-assembled InAs QDs, with information such as the cavity transmission and QD emission spectrum obtained. Adsorption of a gas such as nitrogen ($N_2$) can be used to tune the resonant wavelength of microcavities in a cryogenic environment. Proper regulation of the $N_2$ flow and delivery of the gas near the sample surface can be used to produce reproducible, high-resolution tuning. The fiber taper coupling allows for detailed investigation of the N2 adsorption process.

In FIG. 4, a device mount 402 is provided to support various components including a microcavity light emitter chip 401 comprising a semiconductor quantum dot structure that absorbs excitation energy and emits laser light. A first positioning stage 430 is engaged on the device mount 402 to hold the microcavity light emitter chip 401 and is used to adjust a position of the light emitter chip 401 on the device mount 402. A single-mode fiber 410 is provided to include a thinned taper section between first and second single-mode fiber sections and being located near the microcavity light emitter chip 401 in optical evanescent coupling with the microcavity light emitter chip 401. A fiber holding substrate 423 is provided to hold the fiber taper 410 in a bended U shape under a tension and the center of the thinned taper section 410 is positioned near the microcavity light emitter chip 401. A second, separate positioning stage 422 is mounted on the fiber probe mount 421 to hold the fiber holding substrate 423 and is adjustable to change the position of the fiber holding substrate 423 on the device mount 402. A cryostat unit is placed underneath the device mount 402 to provide cooling to the chip 401 and one or more thermal conductors or braids 403 are connected between the microcavity light emitter 401 and the cryostat unit to maintain the semiconductor quantum dot structure at a cryogenic temperature. A sample mount 431 is used to hold the chip 401 and in thermal contact with the thermal braids 403. A temperature sensor 440 is placed in contact with the sample mount 431 to monitor the temperature of the chip 401. As illustrated, a vacuum chamber 409 is provided to enclose the single-mode fiber including the thinned taper section and the microcavity light emitter under a vacuum condition and is used as a radiation shield. A gas tank outside the vacuum chamber is provided to store an gas and a gas line engaged to the vacuum chamber 409 to comprise a gas tube 450 located near and directed at the microcavity light emitter 401. The gas line is coupled to the insert gas tank to deliver the gas from the gas tank to the microcavity light emitter 401 when cooled to shift a resonance wavelength of the microcavity light emitter by adsorption of the gas on the cooled microcavity light emitter 401.

The fiber tapers used are single mode optical fibers that have been heated and stretched so that their central region has a minimum diameter of $\sim 1$ μm. Potential difficulties in extending fiber taper coupling to a high vacuum, cryogenic environment include the mechanical stability of the fiber taper assembly, the lack of viscous air-damping of fiber taper vibrations, and the mechanical and optical stability of the fiber taper itself under repeated temperature cycling. The device in FIG. 4 can be a modified Janis ST-500 continuous flow, liquid He cryostat. A Teflon-based compression fitting is used to feed the two optical fiber pigtails of the fiber taper from the interior vacuum to the exterior of the cryostat. The fiber taper is held in a "u-shaped" configuration to provide self-tensioning of the taper. Coarse alignment of the taper to the microcavity is achieved by positioning the microcavity sample using slip-stick Y-Z piezopositioners with a displacement range of several millimeters. Fine adjustment in the taper position is provided by an X-Y-Z piezoelectric flexure stage with a maximum displacement of several microns at 4.2 K. A thermally conductive pathway between the sample and the cold finger is provided by copper braids that connect the top sample mount to the cold finger. This ensures that the sample can get to the requisite low temperature (<15 K), which is measured by a silicon diode that is affixed to the top sample mount.

Devices with GaAs/AlGaAs microdisks that were tested as the chip 401 had small diameters of 2 to 4.5 μm and contained a single layer of InAs QDs (room temperature ground state emission at $\sim 1317$ nm). The cryostat is cooled to a sample temperature of 14 K, and during this process, no additional loss in the optical fiber taper transmission is observed (typical total insertion loss is 10%-50% depending on the taper tension). The taper is positioned in the near field of the microdisk under study using the piezostage configuration described above. An adjustable airgap may be maintained between taper and disk or the taper may be placed into direct contact with the disk, depending on the level of cavity loading desired (anywhere from under- to overcoupled is possible). Accuracy in the taper-disk gap is limited only by vibration-induced fluctuations in the taper position (tens of nanometers in our current setup).

Figure 5A:
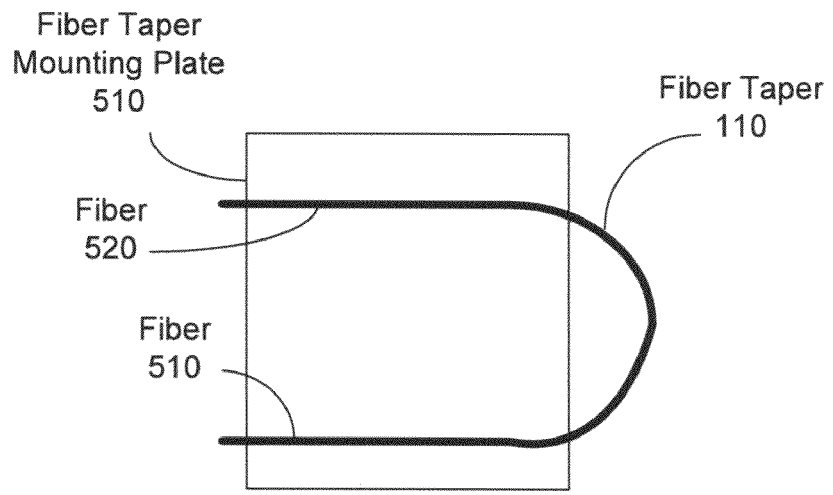
FIGS. 5A and 5B show examples of a fiber taper section bended in a U shape and under a tension.
Figure 5B:
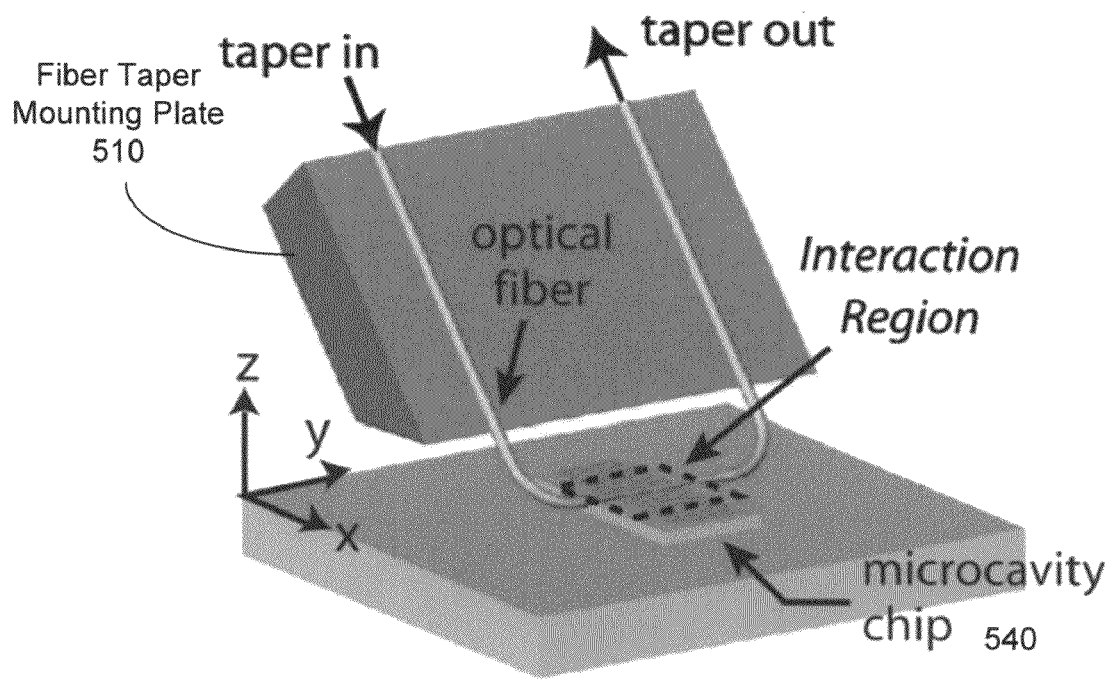

FIGS. 5A and 5B illustrate the fiber taper design where a mounting plate or substrate 510 is used to hold the fiber taper 110 in the U shape. Two adjacent fiber sections 510 and 520 are fixed to the substrate 510 to keep the fiber taper under a tension. FIG. 5B illustrates one mode of operation for using the fiber taper to optically couple a microcavity chip 540. The taper can remain in a fixed coupling position at room or cryogenic temperatures. The fiber taper was also unaffected by repeated temperature cycling. The taper can be used to enhance the collection efficiency of light emitted from microdisk whispering gallery modes (WGMs) by nearly two orders of magnitude over normal-incidence free-space collection.

FIG. 6A compares fiber taper and free-space collection of the low temperature (T=14 K) emission from a D=4.5 μm microdisk that is optically pumped with $\sim 100$ μW of incident power from an 830-nm laser diode. The collected power and number of cavity modes observed in the taper-collected spectrum greatly exceed that obtained by free-space collection, with emission into WGMs from the ground and excited state manifolds of the QDs clearly visible.

More than just an efficient collection optic, the fiber taper may also be used to optically probe and excite the cavity-QD system in a highly efficient manner. The fiber taper was used to monitor the transmission properties of the cavity modes of the microdisk as a function of temperature, and as described below, during cavity mode tuning experiments involving N2 gas adsorption. To this end, a scanning tunable laser (linewidth <5 MHz) is connected to the fiber taper input and the wavelength-dependent taper output transmission is monitored with a photodetector. The polarization state of the fiber taper mode is achieved through a polarization controller inserted between the laser and taper input. FIG. 6(b) shows the transmission spectra of a cavity mode in a D=4.5 µm disk in the 1500 nm band. The cavity mode wavelength is seen to shift approximately 20 nm as the temperature is reduced from 298 to 14 K as a result of the decrease in the AlGaAs disk refractive index. The high-Q modes often appear as a doublet as shown by the inset of FIG. 6(b) due to surface roughness on the microdisk which couples the initially degenerate WGMs into frequency-split standing wave modes. FIG. 6(c) shows the small tuning range of 0.3 nm for T=14-40 K afforded by thermal tuning is a significant limitation in cQED experiments due to the imprecise spectral positioning of QD exciton peaks and cavity modes during growth and fabrication.

Gas adsorption on the sample surface can be used to achieve postfabrication shifts in a photonic crystal cavity. Wavelength tuning was reported in discrete steps by filling a secondary chamber with a gas such as a noble (e.g., Xe) or $N_2$ until a desired pressure is reached, releasing that volume into the cryostat, and then repeating. We found that the fill pressure must lie within a very narrow range, below which no tuning occurs and above which excessively fast tuning occurs. To improve upon the tuning resolution and repeatability, the gas is injected through a 1/16 in. tube (inner diameter of 0.56 mm) that is routed into an opening in the top of the side radiation shield without using the cryostat vacuum line to introduce the gas. Under this design, the gas can be locally delivered with line of sight to the sample. Next, instead of introducing the gas into the cryostat through repeated cycles, we fill an external chamber (V=0.1 l) until a fixed pressure is reached (10 torr) and then release it into the cryostat using a metering valve to control the flow rate. We monitor the cavity mode transmission spectrum and use a shut-off valve to stop the gas flow when a desired wavelength shift is achieved (the shut-off and metering valves are positioned as close as possible to the cryostat to minimize dead volume between themselves and the end of the injection nozzle).

Figure 6:
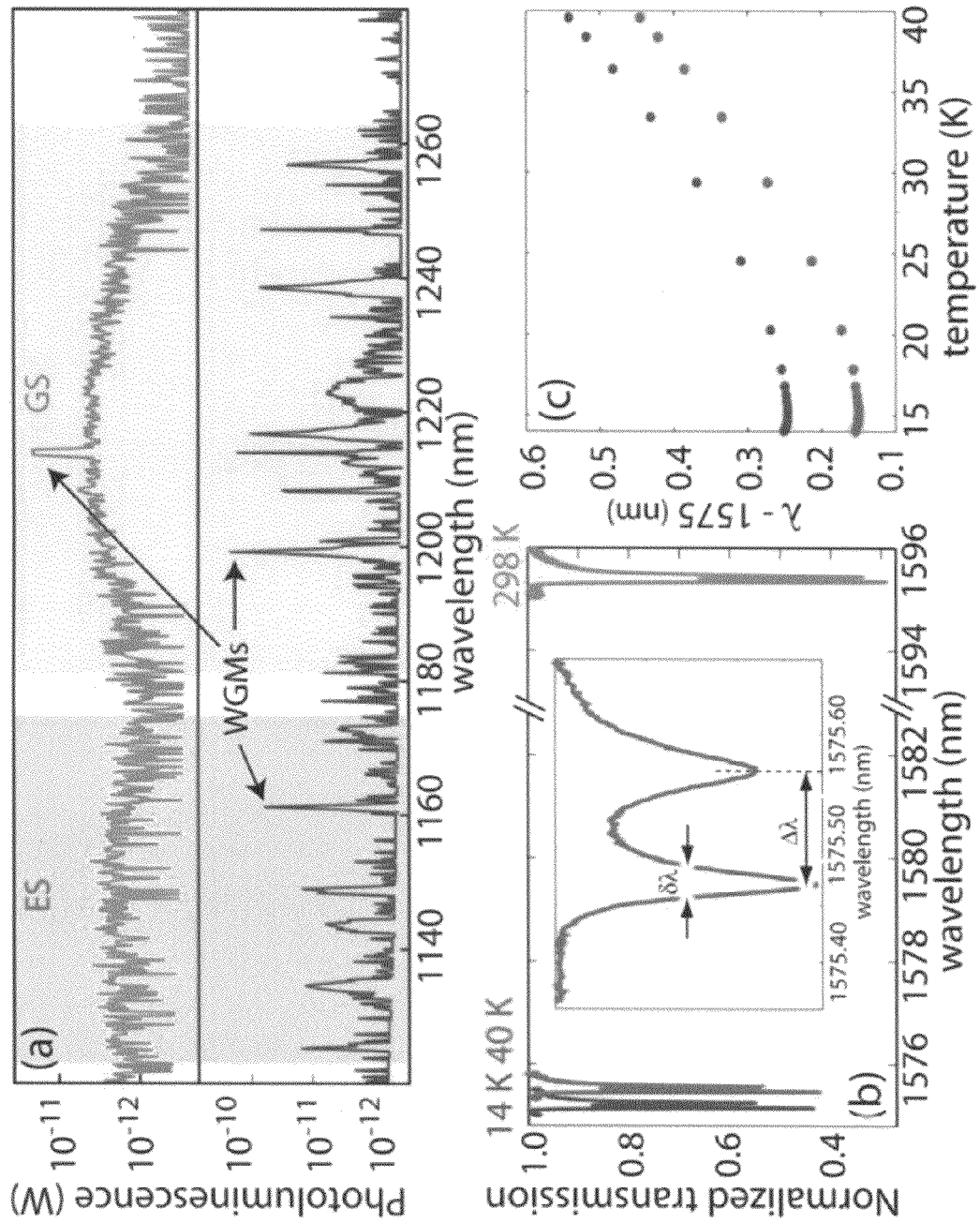
FIG. 6(a) shows a comparison of photoluminescence data from an embedded layer of quantum dots in a microdisk of 4.5 microns in diameter using free-space collection (top) and fiber taper based collection (bottom) using the device in FIG. 4.
FIGS. 6(b) and 6(c) show the spectra of fiber taper collection spectra and temperature tuning data for the $TE_{1,20}$ WGM of the device in FIG. 4, respectively.
Figure 7:
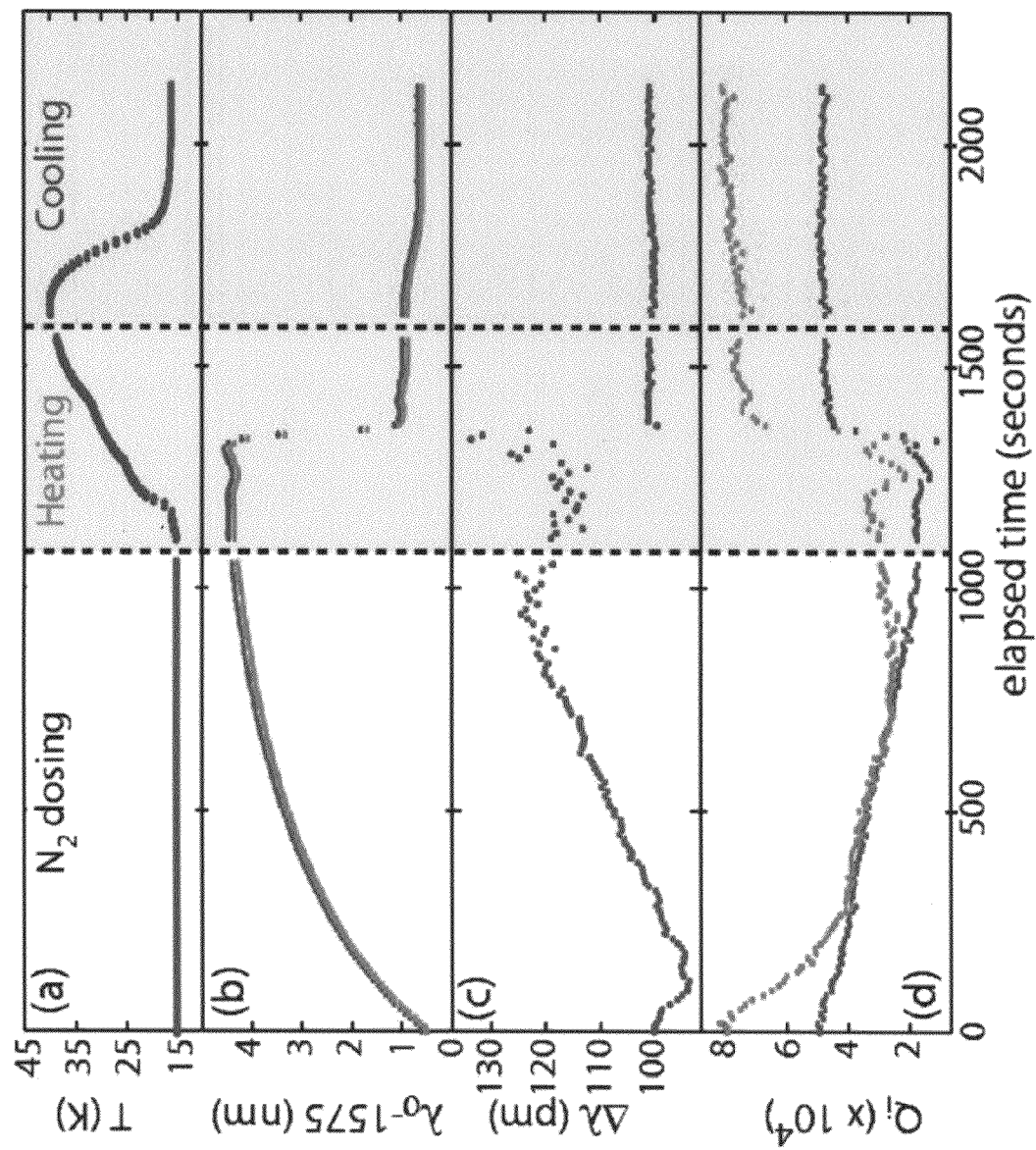
FIGS. 7 and 8 show measurements of the device in FIG. 4.

Tuning data obtained using high purity (99.9995%) $N_2$ gas are shown in FIG. 7 for the microdisk mode studied in FIGS. 6(a) and 6((c), with the taper in contact with the disk edge. Transmission spectra of the taper-coupled microdisk were recorded every 10 s over the entire tuning cycle, which included an initial $N_2$ dosing period, a subsequent $N_2$ desorption phase accomplished by heating the sample with a resistive heater, and a final cool-down period. The cavity transmission spectra were fitted using a standard doublet model, from which we obtain the spectral position of the resonant modes ($\lambda_0$), the doublet mode splitting ($\Delta\lambda$), and the intrinsic cavity Q factor ($Q_i$). FIG. 7(b) shows smooth, continuous tuning is achieved, with a resonance wavelength shift of 3.8 nm occurring after 1060 s of $N_2$ dosing. During the heating phase the $N_2$ shut-off valve is closed, and the wavelength dramatically drops at T=28 K as $N_2$ begins to rapidly desorb from the disk surface. The temperature is further raised to 40 K to ensure complete $N_2$ removal. Finally, the sample is cooled back down to the starting temperature, at which point $\lambda_0$, $\Delta\Delta\lambda$, and $Q_i$ have returned to their original values.

The tuning cycle of FIG. 7 was found to be repeatable from run to run, and could be interrupted during the $N_2$ dosing phase to position the cavity mode resonance wavelength with an accuracy of better than ±10 pm. Once positioned, for temperatures below T=20 K (where $N_2$ desorption is negligible over a time scale of hours17) we found the cavity mode wavelength to be highly stable. One nonideal side effect of the $N_2$ tuning, evident in FIG. 7(d), is the degradation in the Q factor with increasing $N_2$ adsorption (Q-degradation factors of 2-3 for 4 nm of tuning were typical for modes of Q ~$10^5$). Several features in the data of FIG. 7 indicate that the optical loss is due to subwavelength optical scattering from the adsorbed $N_2$ film. The clearest indicator is the rapid rise in doublet splitting with wavelength tuning [FIG. 7(c)], a result of increased surface scattering. Visual inspection of microdisks after large tuning excursions also showed clouding of the top surface. Both observations point to an incomplete wetting of $N_2$ on AlGaAs, and the growth of a rough bulk overlayer consisting of $N_2$ crystallites.

Figure 8:
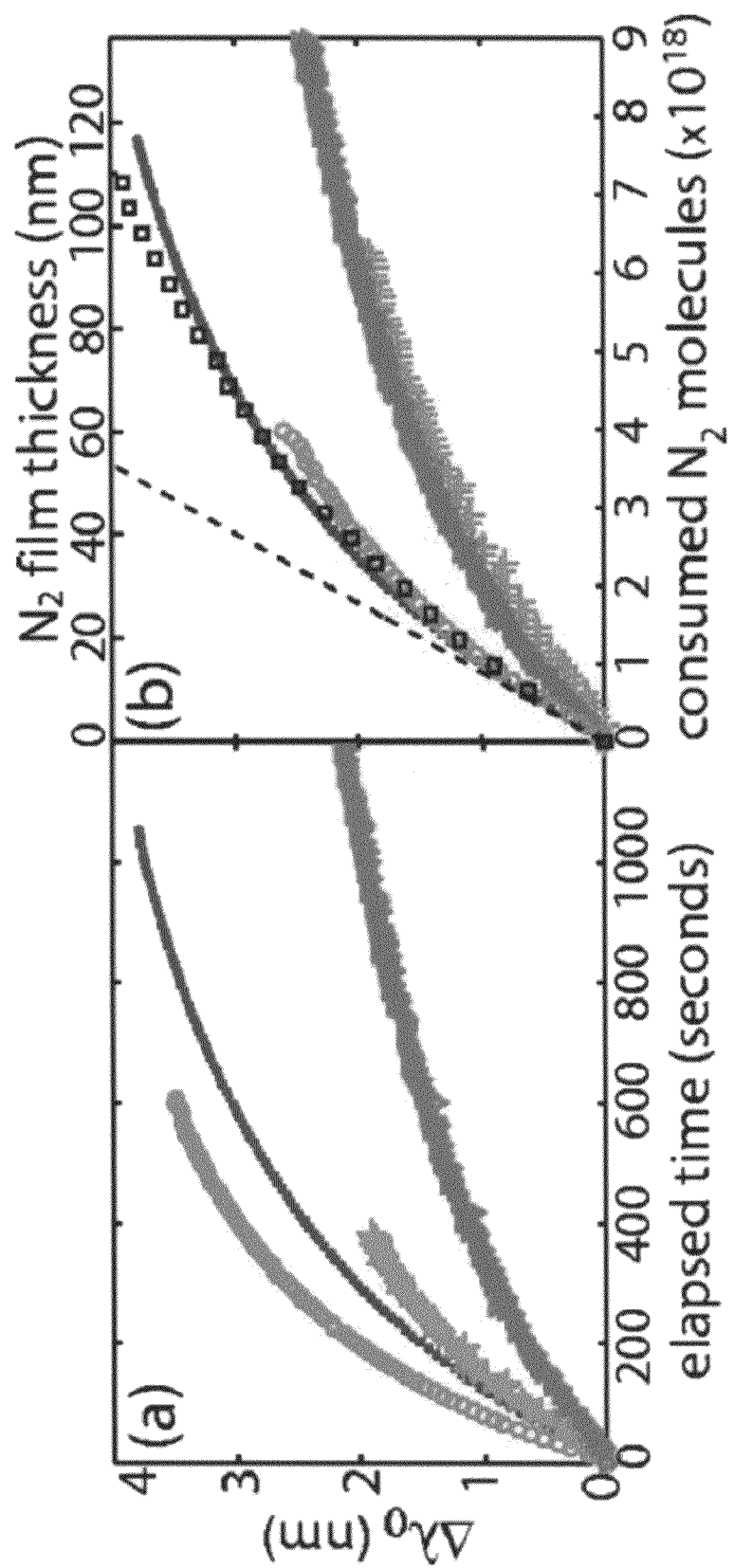

FIG. 8(a) shows the wavelength shift versus elapsed time, under varying flow conditions, and for cavity modes of two different microdisks (D=4.5, and 2.0 µm). A simple perturbative analysis relates the cavity mode tuning to the mode's overlap with the disk surface. Such an analysis yields an N2 film thickness of $t_f \gtrsim 50$ nm for the measured mode tunings of 2-4 nm. For films of this thickness the perturbative analysis breaks down and one must resort to more exact numerical methods. Finite-element method (FEM) simulations of the mode tuning versus $N_2$ film thickness were performed for the $TE_{1,20}$ mode of the D=4.5 µm microdisk, and are plotted in FIG. 8(b) for constant-height $N_2$ coverage of the top and side of the disk (assuming line-of-sight deposition). The measured data are also plotted in FIG. 8(b) versus consumed $N_2$ (estimated from the initial and final chamber pressures, and assuming an exponential decrease in the pressure with time). The simulated $N_2$ thickness is related to the measured $N_2$ consumption with a fixed scaling factor (the sticking coefficient of rare gases to their solids is known to be near unity, i.e., constant), determined by a least-squares fit to the measured data. From these plots the measured tuning is seen to be independent of flow rate for each of the cavity modes, and the saturation in the tuning rate with increasing layer thickness is well captured by the FEM simulation.

Therefore, optical fiber tapers can provide an efficient interface for transferring light to and from standard laboratory fiber optics into a micron-scale cavity housed in a high-vacuum, cryogenic environment. Rare gas adsorption can be used to produce high resolution, continuous tuning of microdisk WGM wavelengths.

A fiber taper may be used to channel emission from single self-assembled QDs embedded in a semiconductor slab directly into a standard single-mode fiber with high efficiency (~0.1%), and to provide submicron spatial resolution of QDs. QDs under study include a single layer of InAs QDs embedded in an In0.15Ga0.85As quantum well in a DWELL structure. The DWELL layer is grown in the center of a GaAs waveguide (total waveguide thickness of 256 nm), which sits atop a 1.5 µm thick Al0.7Ga0.3As buffer layer. The resulting peak of the ground state emission of the ensemble of QDs is located at λ=1.35 µm at room temperature. To limit the number of optically pumped QDs, microdisk cavities of diameter D=2 µµm were fabricated using electron beam lithography and a series of dry and wet etching steps. Although the QDs physically reside in a microcavity, they are nonresonant with the cavity whispering gallery modes (WGMs).

Figure 9:
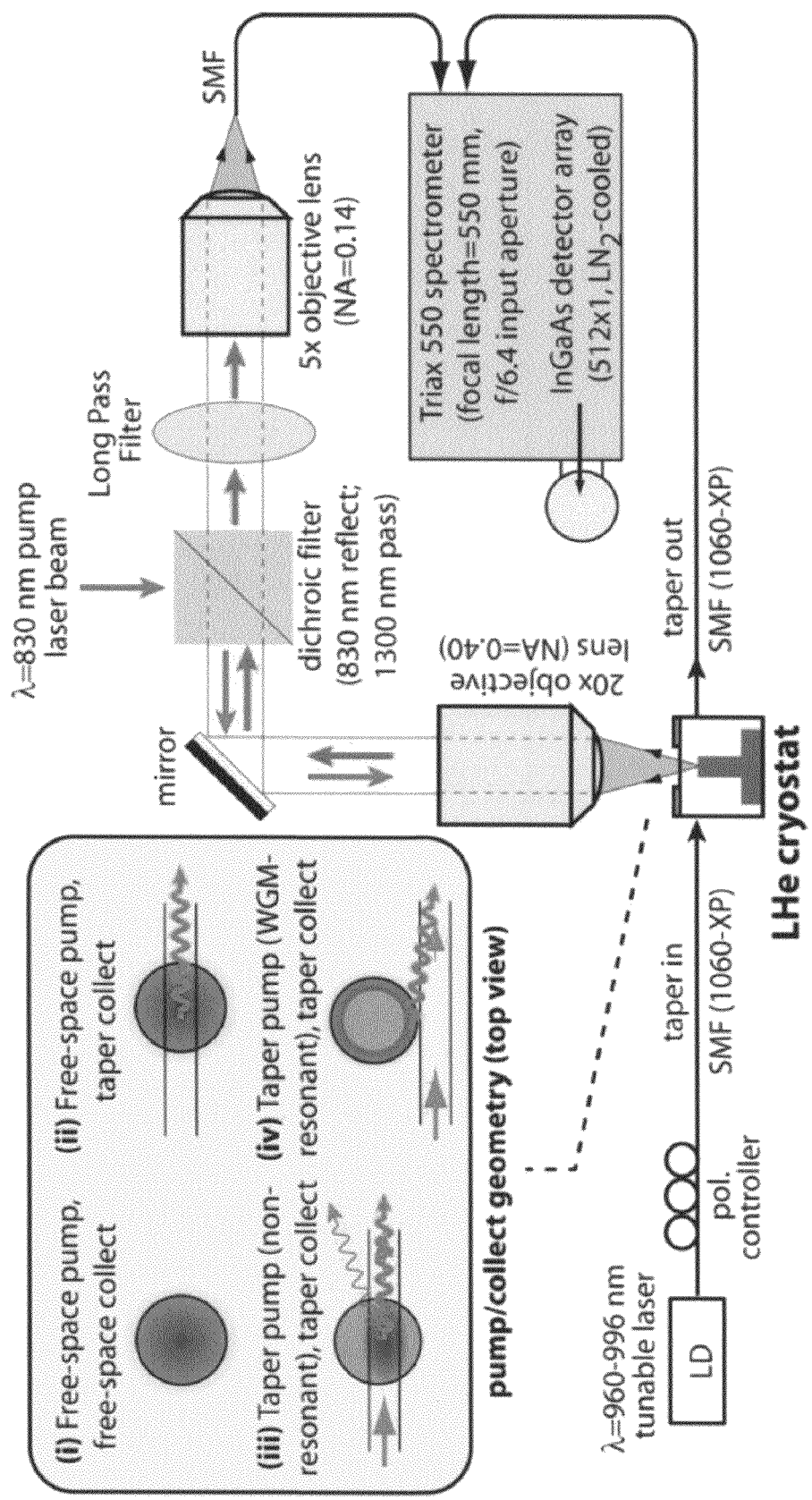
FIG. 9 shows the measurement setup where the samples were mounted in a continuous-flow liquid He cryostat that has been modified to allow sample probing with optical fiber tapers while being held at cryogenic temperatures.
Figure 10:
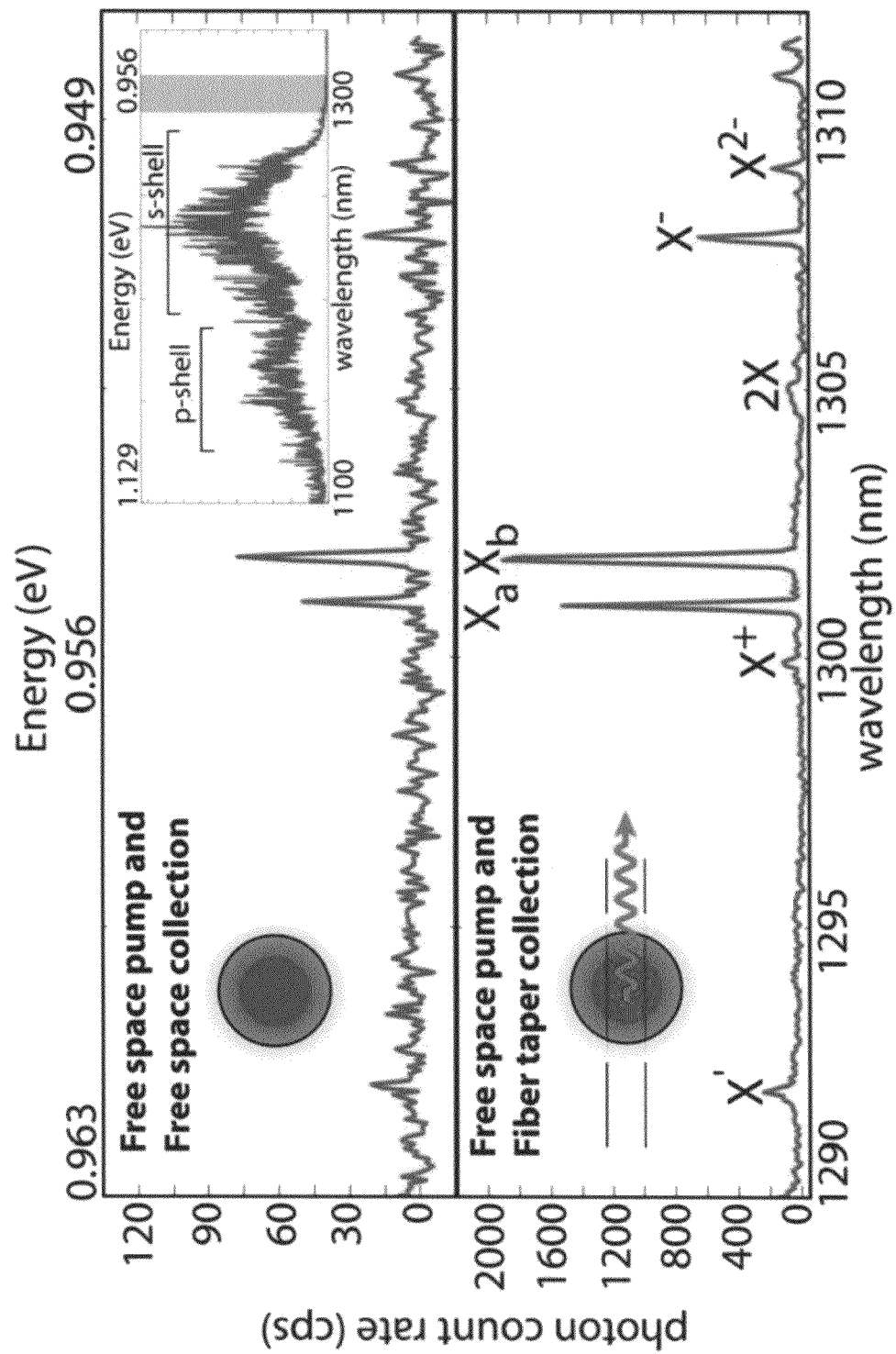
FIGS. 10-12 show measurements obtained from the measurement setup in FIG. 9.

FIG. 9 shows the measurement setup where the samples were mounted in a continuous-flow liquid He cryostat that has been modified to allow sample probing with optical fiber tapers while being held at cryogenic temperatures (T~14 K). The cryostat setup provides any combination of free-space and fiber taper pumping and collection. FIGS. 10-12 show measurements obtained in the setup in FIG. 9

The inset of FIG. 10 shows the emission spectrum from an ensemble of QDs in one of the microdisks. Here, the device is optically pumped through an objective lens at normal incidence (free-space pumping), with a spot size of 3 μm and wavelength $\lambda_p$=830 nm. Clearly present are the ground and excited states (s and p shells) of the ensemble of QDs which, based on the estimated QD density of 300-500 μm$^{-2}$, consists of ~1000 QDs. To study isolated emission lines from single QDs, we focus on the long-wavelength tail end of the QD distribution (λ=1290-1310 nm). In this range, isolated emission lines from a single QD are seen for a fraction (10%) of the interrogated devices. A typical spectrum as collected through the pump lens (free-space collection) from one such device is shown in the top panel of FIG. 10. Under identical pumping conditions, the signal collected through a fiber taper waveguide positioned on top of, and in contact with, the microdisk is shown in the bottom panel of FIG. 10. The taper is a single mode optical fiber that has been heated and stretched down to a minimum radius of a=650 nm, and is installed in the customized liquid He cryostat. The most stark difference between the free-space and fiber taper collected spectra is the 25 times increase in fiber taper collected power. Similar improvement in collection efficiency was measured over all the QDs studied in this work.

Before further studying the fiber taper as a collection optic, we attempt to identify the different QD lines of FIG. 10. Of particular benefit in this assignment is the recent work of Cade et al., who study a DWELL material very similar to that investigated here.

Figure 11A:
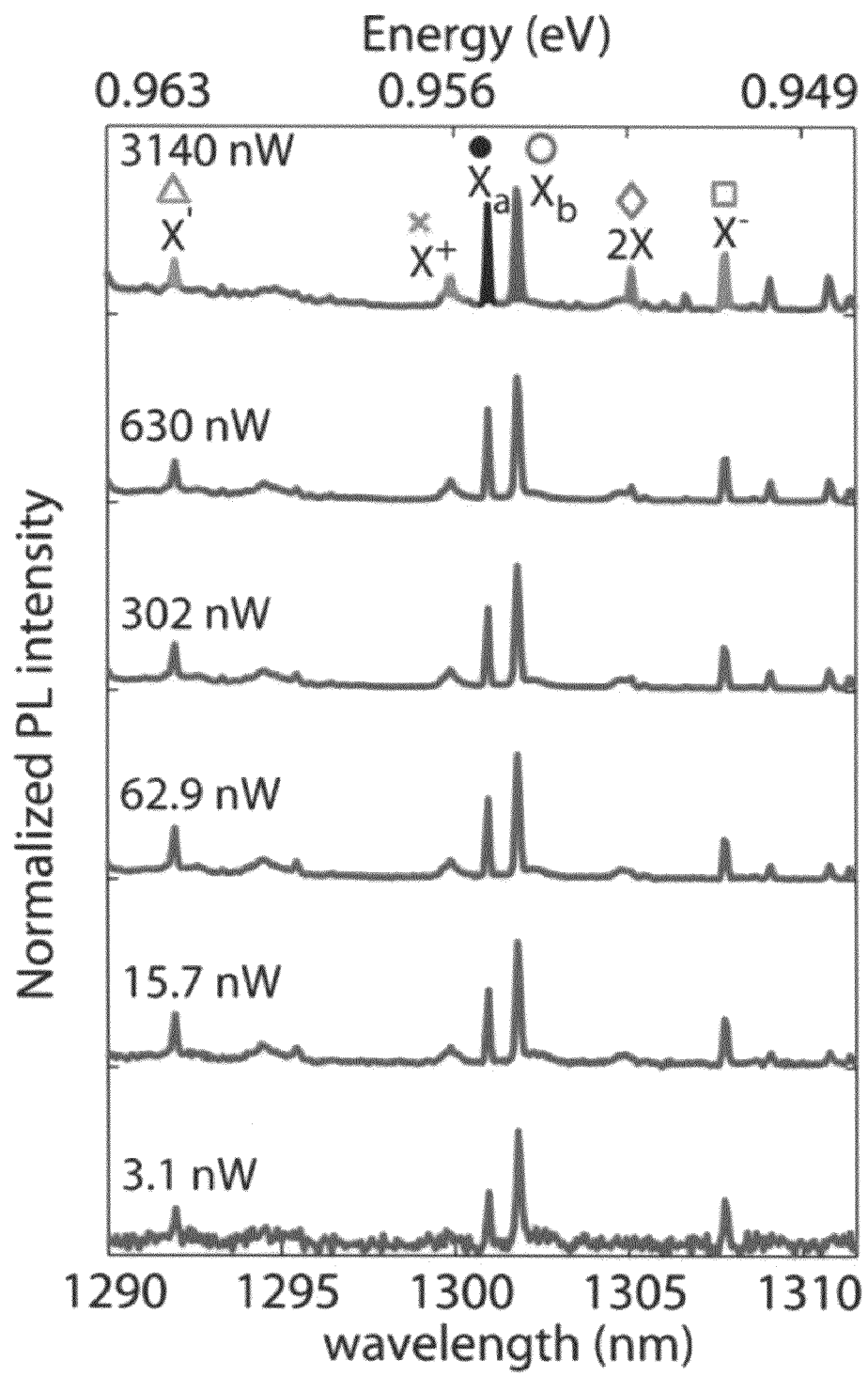
Figure 12:
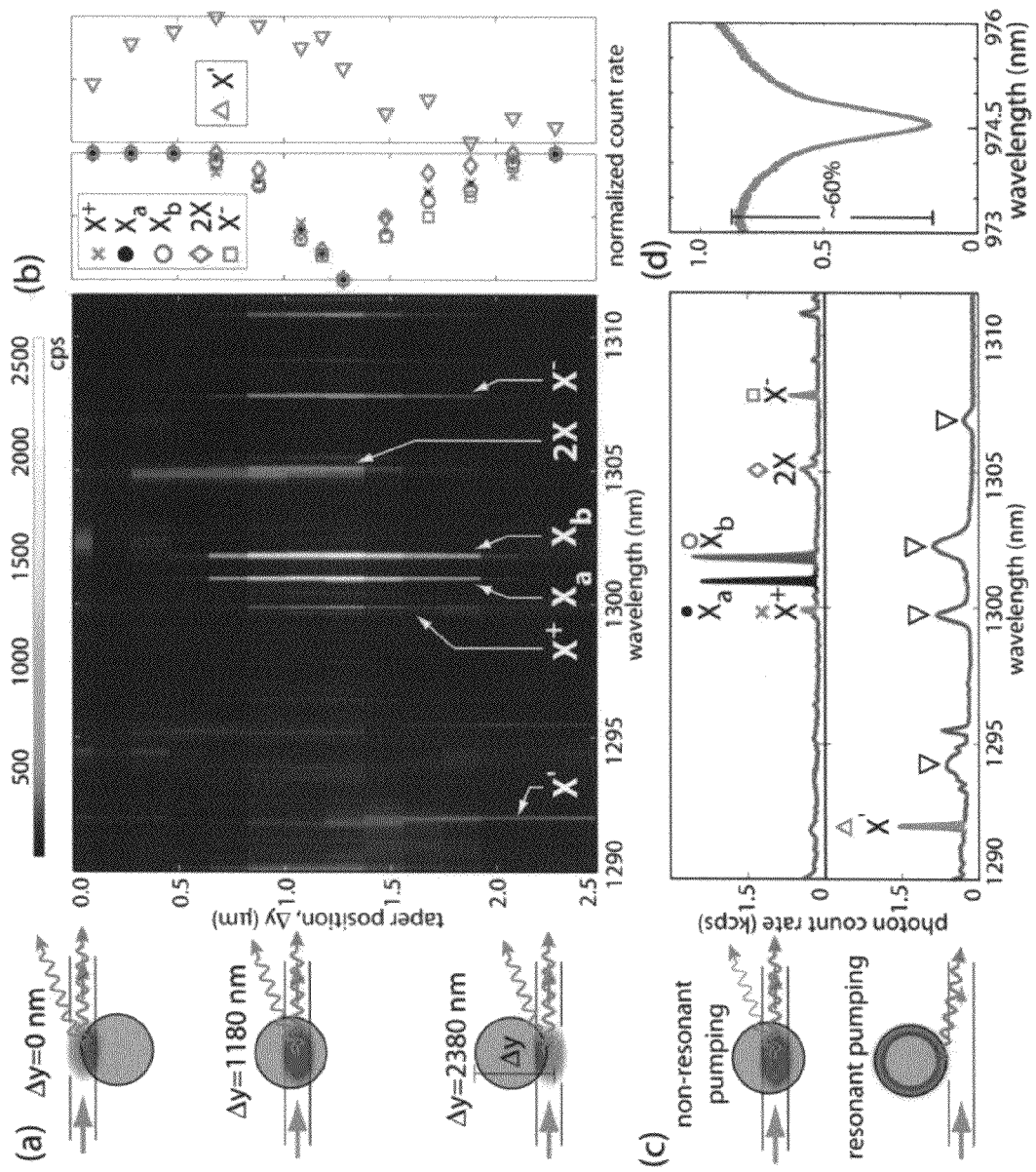

FIGS. 11A, 11B and 11C show taper-collected emission spectra as a function of pump power (free space, $\lambda_p$=830 nm) for a fixed taper position. Emission is first seen for incident powers of a few nanowatts (estimated absorbed powers of tens of picowatts), with excitonic lines centered at 1291.95, 1300.97, 1301.81, and 1307.75 nm. As we discuss later, spatially resolved measurements clearly indicate that the shortest wavelength emission line is unrelated to the latter three and is identified as the polarization-split neutral exciton lines (Xa and Xb) and the negatively charged exciton line (X$^-$). As the pump power is increased, additional emission lines appear, including the positively charged exciton (X$^+$) at 1299.87 nm and the biexciton (2X) line at 1305.11 nm. The X$^-$-X, X$^+$-X, and 2X-X splitting values of 4.6, −1.1, and 2.8 meV match reasonably well with the 5.6, −1.1, and 3.1 meV values measured in Ref. 14, although the fine structure splitting in the X line is significantly larger (600 versus 300 μeV) for this QD.

FIG. 11B shows the plot of the emission level in each QD state against pump power. Below saturation, the emission lines all scale nearly linearly with pump power, except for the 2X line which scales superlinearly. The subquadratic growth rate (n=1.54) is related to the reduced QD symmetry that generated the large $X_a$-X splitting. Finally, the temperature (T) dependence of the X lines is shown in FIG. 1C, where significant broadening is seen for T>50 K. Below this temperature we measure linewidths of 0.1-0.15 nm, roughly corresponding to the spectral resolution of our system (0.1 nm=75 μeV).

A rough estimate of the absolute collection efficiency of the fiber taper is derived by considering the saturated photon count rates for the X lines in FIG. 11B. The measured saturated photon count rate into the Xb line is 1.5×10$^5$ counts/s, which after considering the detector, taper, and spectrometer grating efficiencies (85%, 80%, and 60%), and including light in the backwards fiber channel, corresponds to a taper-collected photon count rate of 7.4×10$^5$ counts/s. Neglecting possible suppression or enhancement of radiation due to the presence of the microdisk, the saturated photon emission rate for InAs QDs is 5−10×10$^8$ counts/s [photon lifetime t=1-2 ns]. This yields an approximate fiber taper collection efficiency of 0.1%. This efficiency is for nonresonant collection, and does not correspond to that attainable for QDs resonant with a high-Q microdisk WGM, which is expected to be much higher due to the Purcell-enhanced emission into a localized cavity model and the efficient taper-WGM coupling. Finally, our estimate of the saturated photon emission rate neglects fluorescence intermittency due to pumping of dark states of the QD; 0.1% is therefore a minimum bound on the efficiency.

An additional benefit of using the fiber taper as a near-field collection optic is the potential for spatially resolved measurements. Although the spatial resolution provided by a glass fiber taper is lower than the sub- 100 nm level achievable through NSOM, valuable information on the spatial location of QDs can be inferred from both the spatially dependent collection and excitation through the fiber taper. For the following measurements, we pump the microdisk through the fiber taper with pump light at 978.3 nm, where only the DWELL is significantly absorbing.

FIG. 12(a) shows a plot of the fiber-collected emission spectrum as a function of taper position along the ŷ axis of the sample (the taper position is adjusted through a piezostage on which it is mounted). FIG. 12(b) plots the spatial dependence of the total photon count rate within each of the QD states identified in FIGS. 11A-C. Of note is the similar spatial dependence of the collected emission from each of the lines {Xa,Xb,X+,X−,2X}, confirming that they originate from the same single QD. The full width at half maximum of the collected emission is roughly 600 nm, giving an estimate of the taper's spatial resolution transverse to its longitudinal axis. Two-dimensional mapping of a QD's position may also be obtained by rotating the sample, and repeating the measurement along the orthogonal axis for the modes of photonic crystal cavities. Finally, in contrast to the other emission lines, emission from the short wavelength X' line at 1292 nm has a quite different dependence on taper position, with collected emission being strongest for the taper at the disk periphery.

Spatial selection of QDs may also be realized by resonantly pumping a microdisk WGM. This excites QDs located in a 250 nm thick annulus at the microdisk perimeter, where the pump beam resides, and efficient taper-WGM coupling allows for an accurate estimate of the absorbed pump power. The QDs located at the disk periphery are of course those that are of interest for cavity quantum electrodynamics (QED) studies involving high-Q, ultrasmall Veff WGMs.

FIG. 12(d) shows a transmission scan of a pump-band WGM with a coupling depth of 60% and Q~1000 (limited by DWELL absorption). The bottom scan of FIG. 12(c) shows the emission spectrum when we pump on resonance with 690 pW of power at the taper input (corresponding to 330 pW of dropped/absorbed power). Emission from the centrally located QD [top scan of FIG. 12(c)] is no longer present, and has been replaced by a pronounced emission peak at 1291.95 nm, corresponding to the X' line, confirming that this emission is likely due to a QD located in the disk periphery. Another difference in comparison to the nonresonant pumping spectrum is the presence of several broad emission peaks. These peaks are due to emission into relatively low-Q, higher-radial-order WGMs of the microdisk, as confirmed by fiber-taper-based transmission spectroscopy of the cavity with a tunable laser. The source of such background emission into detuned cavity modes is not well understood, but has been observed to occur for even large detunings of 10-20 nm. In this case, it is likely that the preferential excitation of QDs that reside in the microdisk perimeter, even those that have exciton lines which are significantly detuned spectrally, results in enhanced emission into the microdisk WGMs.

Therefore, a micron-scale optical fiber taper waveguide, previously demonstrated to be an effective tool for characterization of semiconductor microcavities, can also be used to study single semiconductor quantum dots. As a near-field collection optic, the fiber taper is shown to channel quantum dot light emission directly into a single mode fiber with a high efficiency of 0.1%, and to provide a submicron spatial resolution of QDs. The ability to effectively investigate both microcavities and quantum dots suggests that these fiber tapers can serve as a very versatile tool for studying microphotonic structures, and in particular, for investigations of chip-based cavity QED.

The following sections describe use of a fiber taper waveguide to perform direct optical spectroscopy of a microdisk-quantum-dot system, exciting the system through the photonic (light) channel rather than the excitonic (matter) channel. Strong coupling, the regime of coherent quantum interactions, is demonstrated through observation of vacuum Rabi splitting in the transmitted and reflected signals from the cavity. The fiber coupling method also allows us to examine the system's steady-state nonlinear properties, where we see a saturation of the cavity-QD response for less than one intracavity photon. The excitation of the cavity-QD system through a fiber optic waveguide is key for applications such as high-efficiency single photon sources15,16, and to more fundamental studies of the quantum character of the system. In the most simplified picture, cavity quantum electrodynamics (cQED) consists of a single two-level atom (or equivalent) coupled to an electromagnetic mode of a cavity. A more realistic picture includes dissipative processes, such as cavity loss and atomic decoherence, and excitation of the system, either through the atomic or photonic channel. The observed system response is dependent on both which channel is excited, and what signal is measured. Previous demonstrations of strong coupling between semiconductor microcavities and quantum dots (QDs) used non-resonant optical pumping to excite the QD stochastically and photoluminescence (PL) to probe the system behavior. In this work we excite the system coherently through the photonic channel, and detect signatures of cavity-QD coupling in the resonant optical response. Such optical spectroscopy is commonplace in atom-Fabry-Perot systems1, but is more problematic in semiconductor microcavities due to the comparative difficulty in effectively coupling light into and out of sub-micron structures. To effectively interface with the cavity, we use an optical fiber taper waveguide. Fiber tapers are standard glass optical fibers that have been heated and stretched to a diameter at or below the wavelength of light, at which point the evanescent field of the guided mode extends into the surrounding air and allows the taper to function as a near-field optic.

Figure 13A:
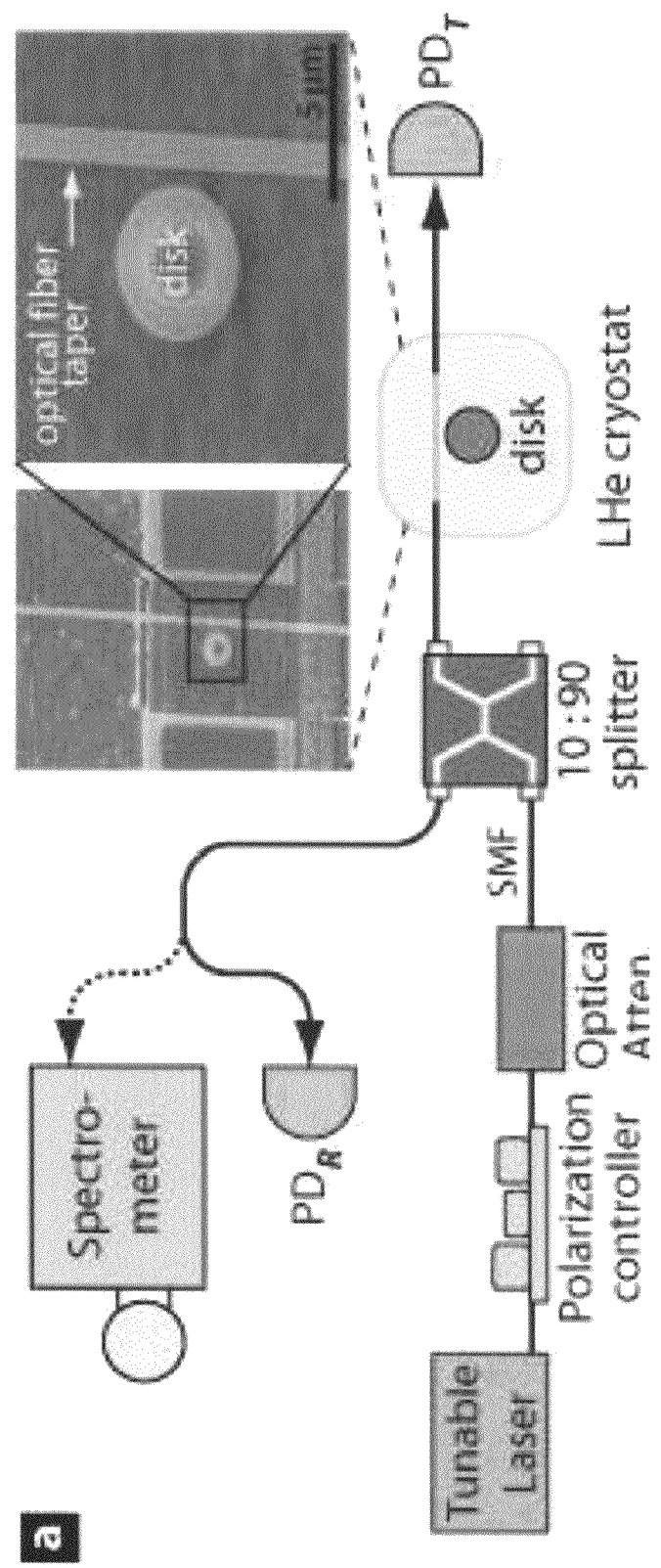

The experimental setup used is shown schematically in FIGS. 13A-13B. At its core is a customized liquid He cryostat in which piezo-actuated stages have been integrated to incorporate optical fiber taper testing while maintaining a sample temperature as low as 12 K. External cavity tunable lasers optically pump the QD and probe the cavity-QD system near resonance, and fused-fiber couplers direct the cavity's reflected and transmitted signals to photodetectors and a spectrometer. The overall transmission of the fiber taper link is 50% in this work, and in many cases can be ≧90%, providing a very low-loss optical channel to probe the system. This allows for the accurate estimation of quantities such as average intra-cavity photon number through measurement of the resonant transmission of the taper waveguide when coupled to the cavity.

The system under investigation consists of InAs QDs embedded in a GaAs microdisk cavity. The InAs QDs are grown in a self-assembled manner with a density of 300-500 $\mu m^{-2}$ on top of an InGaAs quantum well (DWELL). The DWELL structure resides in the middle of a 256 nm thick GaAs layer that forms the thin planar layer of the microdisk (see FIG. 13C). Previous studies of this material indicate that isolated emission from single QDs at cryogenic temperature can be seen in the wavelength range $\lambda$=1290-1310 nm, approximately 50 nm red-shifted from the peak of the QD ensemble emission. Microdisks of diameter D=2.5 µm are created through electron beam lithography, plasma dry etching, and wet undercut etching. Finite-element-method (FEM) simulations in FIGS. 13D and 13E of the microdisks show that the TE whispering gallery mode (WGM) is resonant at $\lambda\sim$1300 nm. This optical mode has a radiation-limited quality factor Qrad>$10^8$, and an effective standing wave mode volume $V_{sw}$=3.2($\lambda$/n)3. The peak coherent coupling rate for a QD excitonic state of the type studied here (i.e., spontaneous emission lifetime $\tau_{sp}$=1 ns) with optimal placement and dipole orientation is $g_0/2\pi$=15 GHz. Since our QDs are not deterministically positioned in the cavity as in recent studies, the actual exhibited coupling rate g may be significantly smaller (see Methods). The magnitude of g relative to the system decay rates, $\kappa_T$ (cavity field decay) and $\gamma\perp$ (QD dephasing), determines whether the system lies in the perturbative (weak coupling: $g<(\kappa_T,\gamma\perp)$) or non-perturbative (strong coupling: $g>(\kappa_T,\gamma\perp)$) regime of cQED.

Figure 14:
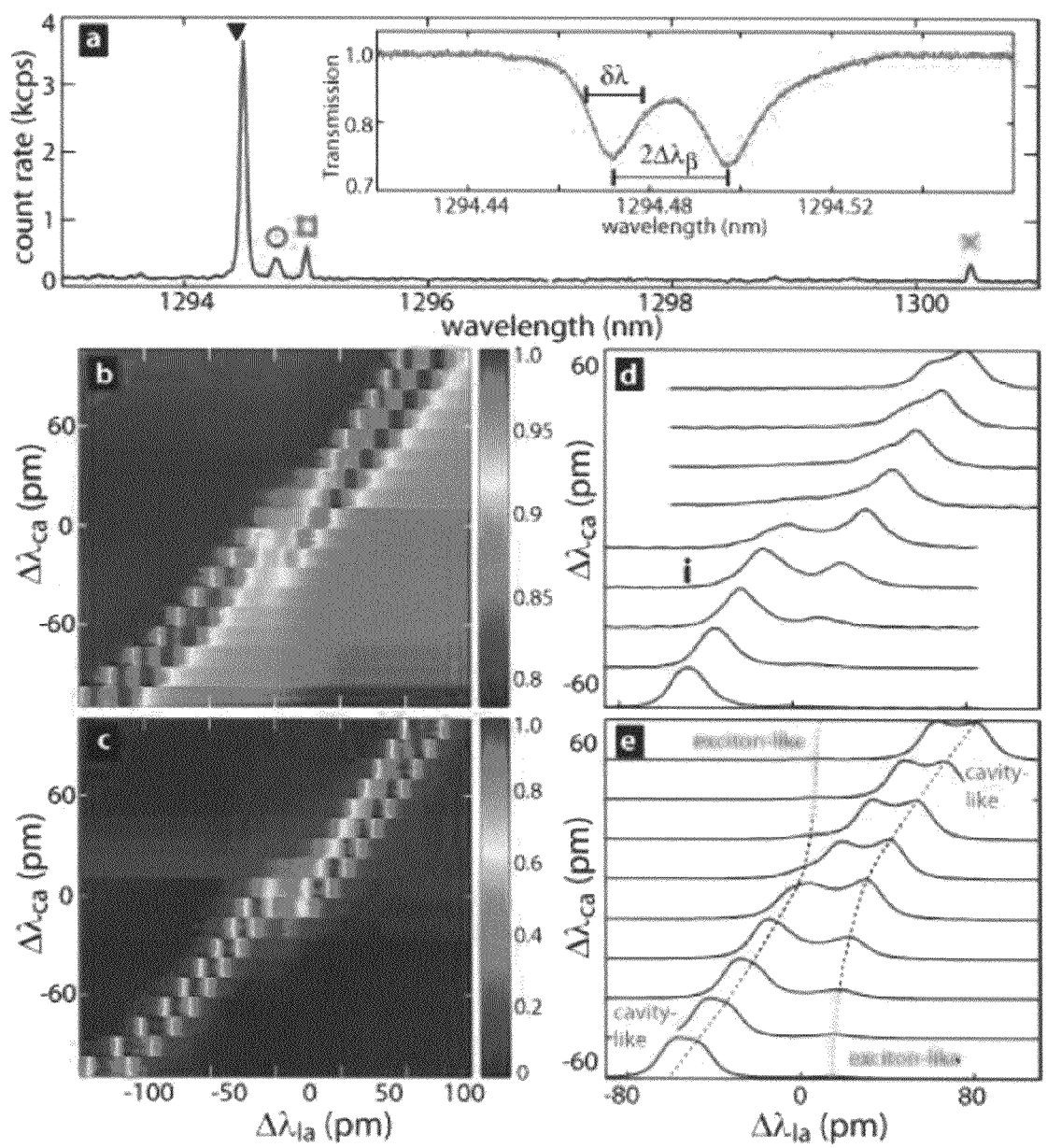
FIGS. 14 and 15 show measurements obtained in the system in FIG. 13A.

The process by which we identify a suitable device for studying cavity-QD coupling is described in the Methods section. FIG. 14(a) shows the fiber-taper-collected PL spectrum from one such device that has been cooled down to 15 K. Optical pumping of the QD is provided by exciting (also through the taper) a blue-detuned higher-order WGM of the disk at $\lambda_P\sim$982.2 nm. The cavity mode, which is fed by background emission processes, is the tall peak at the blue end of the spectrum. The three emission peaks red of the cavity mode are the fine-structure-split neutral single exciton lines, $X_a$ and $X_b$, and the negatively charged single exciton line, $X^-$.

Further insight into the coupled cavity-QD system from PL are masked by the limited resolution of our spectrometer (35 pm). In this case the interesting behavior of the cavity-QD coupling can be studied by resonant spectroscopy of the cavity mode using a fiber-coupled, narrowband (linewidth<5 MHz) tunable laser. The inset to FIG. 14(a) shows the taper's transmission spectrum when it is placed in contact with the side of the microdisk cavity and the cavity modes are detuned from the exciton lines. As has been described in previous work, imperfections on the surface of the microdisk cause backscattering that couples the initially degenerate traveling wave WGMs. If the backscattering rate $\gamma_\beta$ exceeds the total cavity loss rate $k_T$, this mode-coupling results in the formation of standing wave modes which are split in frequency. The transmission scan of FIG. 14(a) illustrates this effect in our system, with $TE_{1,\pm13}$ modes appearing as a resonance doublet with splitting $2\Delta\lambda_\beta$=31 pm. Each mode has a linewidth of 13 pm, corresponding to Q=$10^5$ and $\kappa_T/2\pi$=1.2 GHz.

To tune the cavity into resonance with the Xa and Xb exciton lines of the QD we introduce nitrogen (N2) gas into the cryostat. This allows for continuous and repeated tuning over a 4 nm wavelength range of the cavity modes. For the first set of measurements, we operate with an input power of 470 pW so that the system remains in a weak driving limit with the estimated bare-cavity intracavity photon number $n_{cav}$=0.03. The normalized transmission and reflection spectra over a cavity tuning range of 240 pm are displayed as a two-dimensional intensity image in FIG. 14(b)-(c). Initially, we see a simple shift in the center wavelength of the cavity doublet mode, but once the cavity mode frequency nears the transition frequency of the higher-energy exciton line (Xa) of the QD, the spectra change dramatically. Coupling between the Xa-line and the cavity modes results in a significant spectral splitting (vacuum Rabi splitting) that is evidenced in the characteristic anticrossing within both the transmitted and reflected signals. This anti-crossing is indicative of the cavity taking on the character of the QD exciton, and vice versa, when the system becomes strongly coupled. As the cavity is detuned red of the Xa-line, the spectra regain their initial bare-cavity doublet shape. Further tuning brings the cavity modes into resonance with the Xb exciton state. Only a small frequency shift of the cavity modes (no anti-crossing) is evident in this case, indicating that the Xb state only weakly couples to either cavity mode.

FIG. 14(d) shows a series of reflection scans for a zoomed-in region of cavity tuning, near where the Xa-line and the cavity are in resonance. In general, the character of these spectra is complicated by the bimodal nature of WGM cavities. To adequately model the system, we use a quantum master equation (QME). The model is used to solve for the steady-state reflected and transmitted signals from the cavity as a function of parameters such as cavity-exciton coupling and excitonic dephasing (the bare-cavity properties are known from detuned cavity spectra). One other important parameter is the relative phase, x, between the surface-scattering and exciton mode coupling. The QD-cavity coupling strength with the standing wave modes, gsw1,2, is modified relative to that for traveling wave WGMs by a factor of $(1 \pm e^{i\xi})/\sqrt{2}$.

A series of reflected spectra produced by the model is shown in FIG. 14(e) for a set of parameters, listed in Table 3, which best estimates the measured reflected signal intensity, exciton linewidth, relative coupling to the two standing wave modes, and anti-crossed splitting. These parameters place the Xa exciton state and the TE WGM in the good-cavity limit ($g > \gamma_\perp > \kappa T$) of the strong coupling regime. We note that the achieved gsw1 is about six times smaller than the maximum possible value based on the cavity mode volume, and is likely due to the QD position being sub-optimal. We estimate that the QD is located 300-400-nm inwards from the position of peak field strength of the TE1,13 mode (see FIG. 13D), with the dipole-moment of the Xa-line oriented radially and that of the Xb-line oriented azimuthally. This picture is consistent with the orthogonal Xa-Xb polarization and their relative measured coupling strengths.

parameters are given by $N0 = 2\kappa T\gamma_\perp/g_2$ and $m0 = \gamma k \gamma_\perp/4g_2$. In our system $N_0$=0.44 and $m_0$=0.02 for the standing wave mode (sw1) that couples most strongly to the QD. This indicates that a single QD strongly affects the cavity response, while even an average intracavity photon number that is less than one can saturate the QD response.

Figure 15:
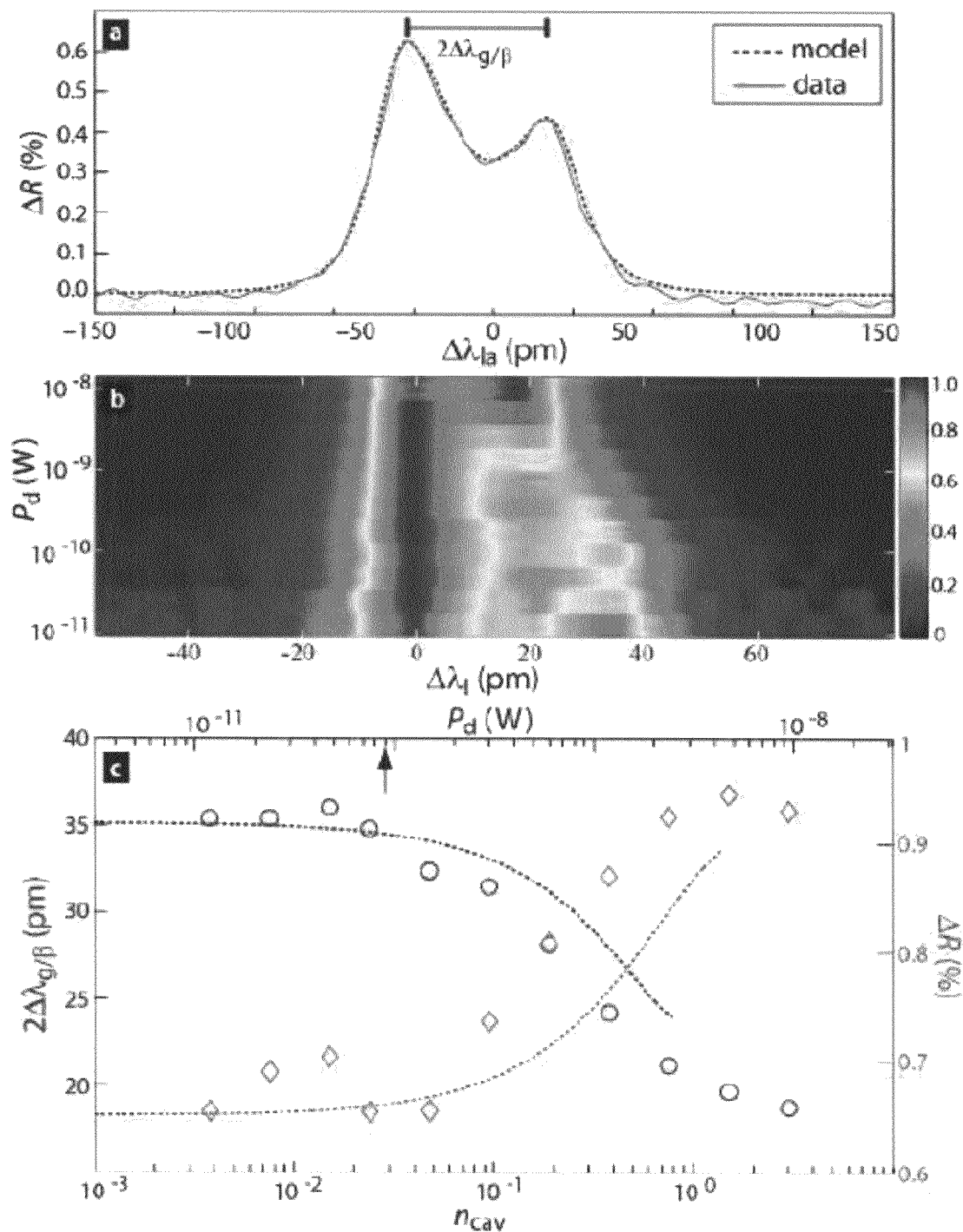

The measured power dependence of the QD-cavity system is shown in FIG. 15, where the cavity is tuned into resonance with the Xa-line near the center of the anti-crossing region (scan marked 'i' in FIG. 14(d)), at which point the resonance peaks are nearly equal mixtures of exciton and cavity mode. FIG. 15(a) shows a plot of the measured reflected signal normalized to input power (DR) along with the modeled steady-state response of the cavity under weak driving conditions ($n_{cav}$=0.03). As the input power to the cavity increases, FIG. 15(b) shows that the spectral splitting due to cavity-QD interaction (2Δλ.g) begins to diminish as the exciton saturates, and finally reaches a regime where the splitting is nearly two times smaller and due to surface-scattering (2Δλ.β). FIG. 15(c) plots the resulting mode splitting (2Δλ.g/β) and peak DR as a function of the optical drive power. Both the splitting and reflected signal begin to saturate towards their bare-cavity values for $n_{cav}$=0.1. The QME model (dotted lines) predicts very similar behavior, albeit with a slightly higher drive power saturation point. Both data and model, however, show an extended saturation regime as expected due to the quantum fluctuations of a single dipole. Such saturation behavior has previously been experimentally observed in atomic systems.

Use of an optical-fiber-based waveguide to efficiently probe the microcavity-QD system opens up many interesting possibilities for future devices and studies. In particular, excitation and collection through the optical channel allows for high resolution spectral and temporal studies of individual QD dynamics and a direct probe of the intra-cavity field. Studies of the quantum fluctuations of the strongly-coupled system, through field and intensity correlations of the optical signal, are also now possible. An immediate application is the creation of an efficient fiber-coupled single photon source, while from a long-term perspective, it can be envisioned that the fiber interface can serve as a means to transfer quantum information to and from the QD. In comparison, atomic systems have the considerable advantages of homogeneity, much lower dephasing, and an energy level structure compatible with more complex manipulations of the quantum system. Nitrogen-vacancy centers in diamond have been viewed as a system that can provide some of the beneficial aspects of cold atoms. The measurement apparatus described here is equally applicable to this and other systems, and we are hopeful that it can be built upon to further progress the development of solid-state cQED nodes with microchip-scalability.

TABLE 3

| Parameter | $V_{tw}$ ($(\lambda/n)^3$) | η | $\kappa_e/2\pi$ (GHz) | $\kappa_i/2\pi$ (GHz) | $\gamma_\beta/2\pi$ (GHz) | ξ (rad.) | $\tau_{rad}$ (ns) | $g_{sw1}$ (GHz) | $g_{sw2}$ (GHz) | $\gamma_\perp/2\pi$ (GHz) | $\gamma_\parallel/2\pi$ (GHz) |
|---|---|---|---|---|---|---|---|---|---|---|---|
| Value | 6.4 | 0.21 | 0.171 | 0.91 | 1.99 | 0.25π | 1 | 2.93 | 1.21 | 1.17 | 0.55 |

The rate at which a single exciton can scatter incoming cavity photons is limited, resulting in a saturation in the strongly-coupled QD-cavity response for large enough input power. Two parameters used to characterize nonlinear processes in cQED are the critical atom number N0 and saturation photon number m0, which gauge the number of atoms needed to alter the cavity response and the number of photons needed to saturate the atomic transition, respectively1. These While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations and enhancements may be made.

What is claimed is:

1. An optical device, comprising:
a microcavity light emitter comprising a semiconductor quantum dot structure that absorbs excitation energy and emits laser light;
a single-mode fiber comprising a thinned taper section between first and second single-mode fiber sections and being located near the microcavity light emitter in optical evanescent coupling with the microcavity light emitter to couple a portion of the laser light out of the microcavity light emitter into at least one of the first and second single-mode fiber sections as an output of the microcavity light emitter, the taper section having a refractive index significantly less than a refractive index of the semiconductor quantum dot structure; and
a movable stage on which the microcavity light emitter is mounted, the movable stage being adjustable in position to control a position of the microcavity light emitter relative to be in optical evanescent coupling with the taper section, wherein the semiconductor quantum dot structure is structured and positioned by the movable stage relative to the taper section to effectuate a phase matching that overcomes a difference between refractive indices of the semiconductor quantum dot structure and the taper section of the single-mode fiber to provide efficient optical evanescent coupling between the tapered section and the semiconductor quantum dot structure,
wherein the microcavity light emitter comprises a semiconductor structure comprising an array of photonic crystal cavities, and wherein the semiconductor quantum dot structure is embedded in an array of photonic crystal cavities, wherein the array of photonic crystal cavities has a spacing between adjacent photonic crystal cavities and a dimension of the photonic crystal cavities to provide the phase matching.

2. The device as in claim 1, wherein:
the semiconductor quantum dot structure includes a single quantum dot.

3. The device as in claim 1, wherein:
the microcavity light emitter comprises an optical whispering gallery mode micro resonator in which the semiconductor quantum dot structure is embedded.

4. The device as in claim 3, wherein:
the semiconductor quantum dot structure includes a single quantum dot.

5. The device as in claim 1, comprising:
a fiber holding substrate to which the first and second single-mode fiber sections are engaged in a way to bend the thinned taper section under a tension and the center of the thinned taper section is positioned near the microcavity light emitter to evanescently couple with the microcavity light emitter.

6. The device as in claim 1, comprising:
a pump laser to produce pump light as the excitation energy; and
a pump optical unit located between the pump laser and the microcavity light emitter to direct the pump light into the microcavity light emitter via free space.

7. The device as in claim 1, comprising:
a pump laser to produce pump light as the excitation energy; and
a pump optical unit located between the pump laser and an end of single-mode fiber to couple the pump light from the pump laser into the single-mode fiber and wherein the thinned taper section evanescently couples the pump light into the microcavity light emitter.

8. The device as in claim 1, comprising:
an electrical driver circuit electrically coupled to the microcavity light emitter to inject an electrical current to electrically excite the semiconductor quantum dot structure to cause emission of the laser light.

9. An optical device, comprising:
a microcavity light emitter comprising a semiconductor quantum dot structure that absorbs excitation energy and emits laser light;
a single-mode fiber comprising a thinned taper section between first and second single-mode fiber sections and being located near the microcavity light emitter in optical evanescent coupling with the microcavity light emitter to couple a portion of the laser light out of the microcavity light emitter into at least one of the first and second single-mode fiber sections as an output of the microcavity light emitter, the taper section having a refractive index significantly less than a refractive index of the semiconductor quantum dot structure;
a movable stage on which the microcavity light emitter is mounted, the movable stage being adjustable in position to control a position of the microcavity light emitter relative to be in optical evanescent coupling with the taper section, wherein the semiconductor quantum dot structure is structured and positioned by the movable stage relative to the taper section to effectuate a phase matching that overcomes a difference between refractive indices of the semiconductor quantum dot structure and the taper section of the single-mode fiber to provide efficient optical evanescent coupling between the tapered section and the semiconductor quantum dot structure; and
a second single-mode fiber comprising a thinned taper section between first and second single-mode fiber sections and being located near the microcavity light emitter in optical evanescent coupling with the microcavity light emitter to couple a portion of the laser light out of the microcavity light emitter into at least one of the first and second single-mode fiber sections as a second output of the microcavity light emitter,
wherein the microcavity light emitter comprises a semiconductor structure comprising an array of photonic crystal cavities, and wherein the semiconductor quantum dot structure is embedded in an array of photonic crystal cavities, wherein the array of photonic crystal cavities has a spacing between adjacent photonic crystal cavities and a dimension of the photonic crystal cavities to provide the phase matching.

10. The device as in claim 9, wherein:
the single-mode fiber and the second single-mode fiber are evanescently coupled in two different optical modes of the microcavity light emitter to produce two different outputs from the microcavity light emitter.

11. An optical device, comprising:
a device mount;
a microcavity light emitter comprising a semiconductor quantum dot structure that absorbs excitation energy and emits laser light;
a first positioning stage engaged on the device mount to hold the microcavity light emitter, the first positioning stage to adjust a position of the light emitter on the device mount;
a single-mode fiber comprising a thinned taper section between first and second single-mode fiber sections and being located near the microcavity light emitter in optical evanescent coupling with the microcavity light emitter to couple a portion of the laser light out of the microcavity light emitter into at least one of the first and second single-mode fiber sections as an output of the microcavity light emitter, the taper section having a refractive index significantly less than a refractive index of the semiconductor quantum dot structure;
a fiber holding substrate to which the first and second single-mode fiber sections are engaged in a way to bend the thinned taper section under a tension and the center of the thinned taper section is positioned near the microcavity light emitter to evanescently couple with the microcavity light emitter;
a second positioning stage on which the fiber holding substrate is mounted, the second positioning stage being adjustable in position to control a position of the fiber holding substrate on the device mount;
a cryostat unit to provide cooling; and
at least one thermal conductor connected between the microcavity light emitter and the cryostat unit which cools the microcavity light emitter to place the semiconductor quantum dot structure at a cryogenic temperature, wherein the semiconductor quantum dot structure is structured and positioned by the first and second positioning stages relative to the taper section to effectuate a phase matching that overcomes a difference between refractive indices of the semiconductor quantum dot structure and the taper section of the single-mode fiber to provide efficient optical evanescent coupling between the tapered section and the semiconductor quantum dot structure,
wherein the microcavity light emitter comprises a semiconductor structure comprising an array of photonic crystal cavities, and wherein the semiconductor quantum dot structure is embedded in an array of photonic crystal cavities, wherein the array of photonic crystal cavities has a spacing between adjacent photonic crystal cavities and a dimension of the photonic crystal cavities to provide the phase matching.

12. The device as in claim 11, comprising:
a vacuum chamber enclosing, at least, a part of the single-mode fiber including the thinned taper section and the microcavity light emitter under a vacuum condition.

13. The device as in claim 12, comprising:
a gas tank outside the vacuum chamber storing a gas; and
a gas line engaged to the vacuum chamber to comprise a gas tube located near and directed at the microcavity light emitter, the gas line coupled to the gas tank to deliver the gas from the gas tank to the microcavity light emitter when cooled to shift a resonance wavelength of the microcavity light emitter by adsorption of the gas on the cooled microcavity light emitter.

14. The device as in claim 12, wherein:
the thinned taper section of the single-mode fiber is maintained at a temperature higher than a temperature of the microcavity light emitter.

15. The device as in claim 11, comprising:
a pump laser to produce pump light as the excitation energy; and
a pump optical unit located between the pump laser and the microcavity light emitter to direct the pump light into the microcavity light emitter via free space.

16. The device as in claim 11, comprising:
a pump laser to produce pump light as the excitation energy; and
a pump optical unit located between the pump laser and an end of single-mode fiber to couple the pump light from the pump laser into the single-mode fiber and wherein the thinned taper section evanescently couples the pump light into the microcavity light emitter.

17. The device as in claim 11, comprising:
an electrical driver circuit electrically coupled to the microcavity light emitter to inject an electrical current to electrically excite the semiconductor quantum dot structure to cause emission of the laser light.

* * * * *